(12) United States Patent
Toyoda

(10) Patent No.: US 7,732,003 B2
(45) Date of Patent: Jun. 8, 2010

(54) BANK FORMING METHOD, WIRING PATTERN FORMING METHOD, ELECTRO-OPTICAL DEVICE, AND ELECTRONIC APPARATUS

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1268 days.

(21) Appl. No.: 10/898,184

(22) Filed: Jul. 26, 2004

(65) Prior Publication Data

US 2005/0058840 A1 Mar. 17, 2005

(30) Foreign Application Priority Data

Aug. 8, 2003 (JP) ............................. 2003-290656

(51) Int. Cl.
*B05D 5/12* (2006.01)
(52) U.S. Cl. ...................... 427/58; 428/428; 428/430; 430/311
(58) Field of Classification Search ................ 427/58; 428/428, 430; 430/311
See application file for complete search history.

(56) References Cited

U.S. PATENT DOCUMENTS

| 4,806,506 | A | | 2/1989 | Gibson, Jr. | |
|---|---|---|---|---|---|
| 6,098,544 | A | * | 8/2000 | Figov | ........................ 101/457 |
| 6,123,803 | A | | 9/2000 | Genut et al. | |
| 6,196,129 | B1 | * | 3/2001 | Kellett | ........................ 101/467 |
| 6,235,445 | B1 | | 5/2001 | Nakamura et al. | |
| 6,451,506 | B1 | * | 9/2002 | Verlinden et al. | ........... 430/302 |
| 7,198,816 | B2 | * | 4/2007 | Masuda et al. | ............. 427/97.3 |
| 2002/0043170 | A1 | * | 4/2002 | Bronstein et al. | ........... 101/453 |
| 2002/0045270 | A1 | * | 4/2002 | Schurenberg et al. | ....... 436/174 |
| 2002/0100384 | A1 | * | 8/2002 | Rorke et al. | ................. 101/453 |
| 2003/0087073 | A1 | * | 5/2003 | Kobayashi | .................. 428/209 |

FOREIGN PATENT DOCUMENTS

| JP | A-63-060788 | | 3/1988 |
|---|---|---|---|
| JP | A- 1-121858 | | 5/1989 |
| JP | A-05-074704 | | 3/1993 |
| JP | A 6-347637 | | 12/1994 |
| JP | A-09-306666 | | 11/1997 |
| JP | A-10-301261 | | 11/1998 |
| JP | A 2000-001055 | | 1/2000 |
| JP | A-2000-500285 | | 1/2000 |
| JP | A 2001-130141 | | 5/2001 |
| JP | A 2001-164383 | | 6/2001 |
| JP | A-2001-166125 | | 6/2001 |
| JP | 2001-281438 | * | 10/2001 |
| JP | A-2001-281438 | | 10/2001 |
| JP | A 2002-019008 | | 1/2002 |
| JP | A-2003-072217 | | 3/2003 |
| JP | A 2003-211861 | | 7/2003 |
| JP | A 2004-039846 | | 2/2004 |

* cited by examiner

*Primary Examiner*—Binh X Tran
*Assistant Examiner*—Mahmoud Dahimene
(74) *Attorney, Agent, or Firm*—Oliff & Berridge, PLC

(57) ABSTRACT

Aspects of the invention can provide a bank forming method capable of forming banks having a good shape with excellent productivity. Banks for partitioning a predetermined area of a base member can be formed on the base member by radiating light onto the base member on which a sublimation layer containing a sublimation material is formed and sublimating the sublimation material.

11 Claims, 14 Drawing Sheets

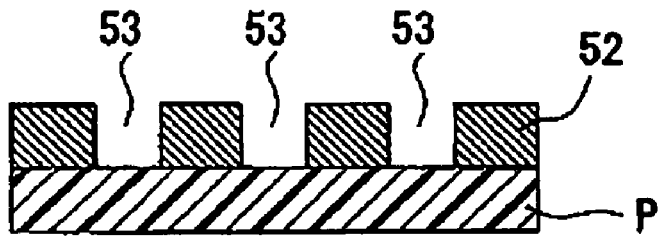
FIG. 10(a)
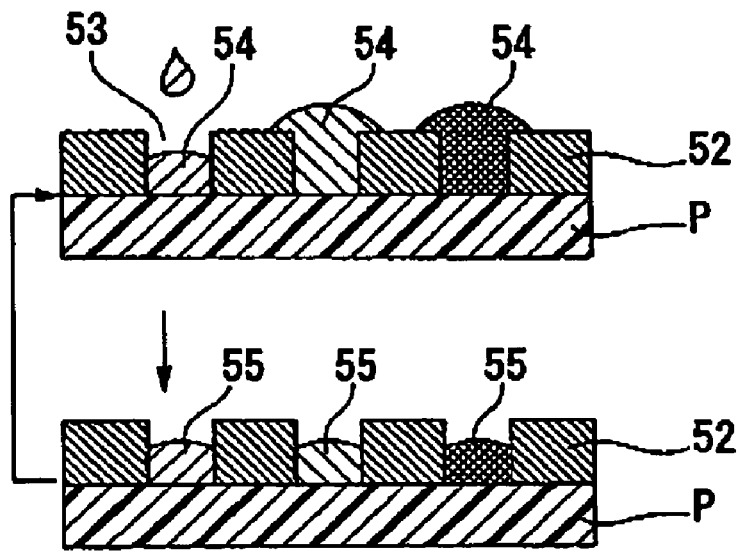
FIG. 10(b)
FIG. 10(c)
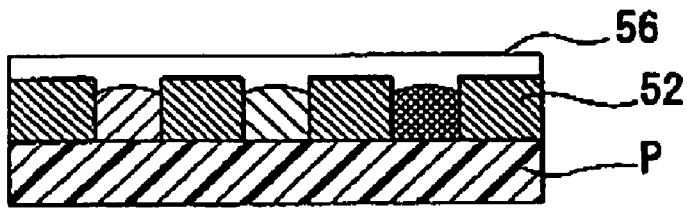
FIG. 10(d)
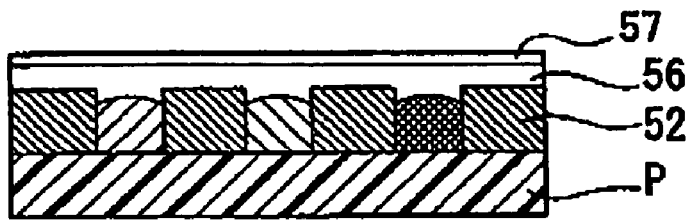
FIG. 10(e)
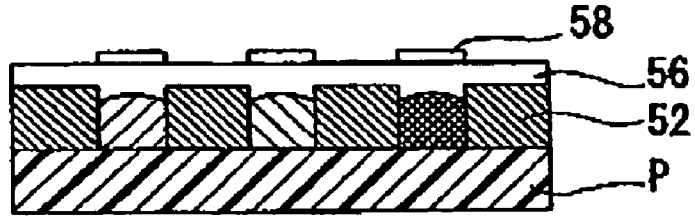
FIG. 10(f)

BANK FORMING METHOD, WIRING PATTERN FORMING METHOD, ELECTRO-OPTICAL DEVICE, AND ELECTRONIC APPARATUS

BACKGROUND OF THE INVENTION

1. Field of Invention

Aspects of the invention can relate to a bank forming method of partitioning a predetermined area on a base member, a wiring pattern forming method using the banks, an electro-optical device, and an electronic apparatus.

2. Description of Related Art

Related methods of manufacturing devices having minute wiring patterns, such as semiconductor integrated circuits, include the photolithography method which has been widely used, and device manufacturing methods using a liquid droplet ejecting method (an inkjet method) have also been of interest. When the minute wiring patterns are formed using the liquid droplet ejecting method, a method of forming banks as partitioning members on a base member so as to enhance precision of the pattern line width and arranging droplets of functional solutions between the banks has been suggested. Further, in Japanese Unexamined Patent Application Publication No. 6-347637, a technique of arranging functional solutions having a specific surface tension between the banks (black matrix) by using the liquid droplet ejecting method is disclosed, where the banks (black matrix) are formed using the photolithography method. Furthermore, in Japanese Unexamined Patent Application Publication No. 2001-130141, a technique of bringing a donor sheet, in which a transfer layer is provided, into close contact with a substrate, transferring a part of the transfer layer to the substrate by radiating a laser beam onto the donor sheet, and utilizing the transferred transfer layer as the banks is disclosed.

SUMMARY OF THE INVENTION

However, the aforementioned related arts have the following disadvantages. As disclosed in Japanese Unexamined Patent Application Publication No. 6-347637, in the case where the banks are formed using the photolithography method, many processes such as a developing process, etc. are required, thereby lowering productivity. In addition, as disclosed in Japanese Unexamined Patent Application Publication No. 2001-130141, in the case where the banks are transferred to a substrate from a donor sheet, a bad transfer condition can cause shape deterioration of the banks formed on the substrate.

Aspects of the invention can provide a bank forming method capable of forming a bank having a good shape with excellent productivity. In addition, it is also an object of the invention to provide a wiring pattern forming method of forming a wiring pattern using the bank, an electro-optical device having the wiring pattern, and an electronic apparatus.

In order to achieve the above object, there can be provided a bank forming method of forming a bank for partitioning a predetermined area of a base member on the base member, by radiating light onto the base member on which a sublimation layer containing a sublimation material is formed and sublimating the sublimation material. Here, the sublimation material may contain a sublimation pigment. According to the invention, by radiating the light onto the base member having the sublimation layer, the sublimation material is sublimated due to the heat resulting from the radiated light and thus the sublimation material can be removed. Accordingly, by radiating the light onto areas corresponding to bank patterns to be formed, the sublimation material of the light-radiated area is removed and thus the banks having a desired pattern can be formed on the base member. Further, according to the invention, since the banks are formed by removing the sublimation material of portions corresponding to the light-radiated areas, the banks can be formed without performing the transfer process, so that it is possible to prevent deterioration of a bank shape due to transfer irregularity, etc.

In the bank forming method according to the invention, a photothermal conversion layer containing a photothermal conversion material for converting optical energy into thermal energy may be provided on the base member. As a result, by efficiently converting the optical energy of the radiated light into the thermal energy and supplying the thermal energy to the sublimation material of the sublimation layer, the sublimation material can be sublimated and removed from the base member. Specifically, by providing the photothermal conversion layer between the base member and the sublimation layer and allowing the sublimation layer to be opened (exposed) externally, the sublimation material can be smoothly discharged (sublimated) externally. Furthermore, in the bank forming method according to the present invention, the photothermal conversion material may be mixed into the base member and the photothermal conversion material may be mixed into the sublimation layer. In this construction, the optical energy of the radiated light can be also converted into the thermal energy and the thermal energy can be supplied to the sublimation material.

In the exemplary bank forming method according to the invention, an adjusting material for adjusting an affinity for liquid may be mixed into the sublimation layer. As a result, when a functional solution is arranged with respect to the banks after forming the banks, a position or a damping and diffusing condition of the functional solution to be arranged can be controlled. In this case, a plurality of sublimation layers having different affinities for liquid may be stacked. As a result, the position or the damping and diffusing condition of the functional solution to be arranged can be controlled more preferably. Specifically, by utilizing a construction where a first sublimation layer and a second sublimation layer having a more lyophobic property than that of the first sublimation layer are stacked on the base member in this order, for example, when the functional solution is arranged between the banks after forming the banks, the functional solution can be damped and diffused well in the vicinity of the bottoms between the banks. In addition, even when the functional solution is arranged in the vicinity of the tops of the banks, the functional solution in the vicinity of the tops can be allowed to flow down and can be arranged in the bottoms due to the lyophobic areas of the tops. Furthermore, instead of mixing the adjusting material into the sublimation layer for forming the banks in advance, a surface treatment for adjusting the affinity for liquid may be performed after radiating the light. By utilizing this construction, the functional solution can be also arranged well between the banks.

In the bank forming method according to the invention, the light may be radiated from one surface side of the base member on which the sublimation layer is provided, and the light may be radiated from the other surface side of the base member on which the sublimation layer is not provided. When the light is radiated from the one surface side, the light can be radiated to the sublimation layer or the photothermal conversion layer without passing through the base member, so that the light can be radiated to desired positions without generating variation of the light-radiated position due to diffraction or scattering of light resulting from interposing the base member and thus the banks having a desired shape can be formed. Further, when the light is radiated from the other surface side, the light can be radiated directly to the photothermal conversion layer through the base member by providing the photothermal conversion layer between the base member and the sublimation layer, so that the optical energy can be efficiently converted into the thermal energy and the thermal energy can be supplied to the sublimation layer. In this case, the sublimation material of the sublimation layer to which the thermal energy has been supplied is smoothly discharged (sublimated) externally.

In the bank forming method according to the invention, the light may be a laser beam, and light having a wavelength corresponding to the photothermal conversion material may be radiated. As a result, the optical energy applied to the photothermal conversion material can be efficiently converted into the thermal energy.

In the bank forming method according to the invention, the light may be radiated to the base member through a mask having a predetermined pattern. As a result, minute bank patterns smaller than a beam diameter of the radiated light can be formed. On the other hand, the light radiation may be performed while relatively moving the base member with respect to the light. That is, the bank patterns may be drawn while relatively moving the radiated light (laser beam) and the base member, and in this construction, a process of manufacturing the mask can be omitted.

In the bank forming method according to the invention, the material separated from the base member may be vacuumed and removed. According to the invention, by vacuuming the sublimated sublimation material and the other material separated from the base member, the materials can be removed, so that the separated (sublimated) material can be prevented from being attached to the base member again.

Further, according to another aspect of the invention, there is also provided a wiring pattern forming method of forming the wiring patterns on the base member by arranging liquid droplets containing a wiring pattern forming material between the banks formed using the aforementioned bank forming method. According to the invention, by utilizing the liquid droplet ejecting method, it is possible to form the minute wiring patterns well while preventing waste of the material to be consumed.

Further, according to another aspect of the invention, there is also provided an electro-optical device having the wiring patterns formed on the base member using the wiring pattern forming method. According to another aspect of the invention, there is also provided an electronic apparatus comprising the aforementioned electro-optical device. According to the invention, since the minute wiring patterns formed using the liquid droplet ejecting method can be provided, it is possible to provide an electro-optical device and an electronic apparatus having the electro-optical device, which can achieve desired performance. Further, examples of the electro-optical device may include a liquid crystal display device, an organic EL (Electroluminescence) display device, and a plasma display device.

A bank is a partitioning member for partitioning a predetermined area on a base member, and includes a bank for achieving precision of a pattern line width of a wiring pattern, etc., a bank (black matrix) provided in a color filter of a liquid crystal display device and isolating adjacent pixels, a bank provided in an organic EL display device and isolating adjacent pixels, and so on.

The aforementioned liquid droplet ejecting method can be embodied using a liquid droplet ejecting apparatus comprising an ejecting head and the liquid droplet ejecting apparatus that can include an inkjet apparatus having an inkjet head. The inkjet head of the inkjet apparatus can quantitatively eject liquid droplets of a liquid material including a functional solution by using the inkjet method, and can quantitatively and intermittently drop a liquid material of, for example, 1 to 300 ng per dot. The liquid droplet ejecting apparatus may be a dispenser.

The liquid material means a medium having viscosity capable of being ejected (dropped) from ejecting nozzles of the ejecting head of the liquid droplet ejecting apparatus. Whether the liquid material is aqueous or oily is irrelevant. It is sufficient as long as the liquid material has fluidity (viscosity) capable of being ejected from the ejecting nozzles, and even when a solid material is mixed thereto, it is sufficient as long as they form a fluid as a whole. The material contained in the liquid material may be heated and dissolved at a temperature higher than a melting point, may be mixed as fine particles in a solvent, and dyes, pigments, or other functional materials may be added thereto in addition to the solvent.

Further, the functional solution is a liquid material containing a functional material, and performs a predetermined function through arrangement on the base member. Examples of the functional material may include a liquid crystal display device forming material used for forming a liquid crystal display device including a color filter, an organic EL display device forming material used for forming an organic EL (Electroluminescence) display device, a plasma display device forming material used for forming a plasma display device, and a wiring pattern forming material containing metal for forming a wiring pattern for supplying power, and so on.

BRIEF DESCRIPTION OF THE DRAWINGS

The invention will be described with reference to the accompanying drawings, wherein like numerals reference like elements, and wherein:

FIG. 10 is a diagram illustrating an example of an electro-optical device manufactured using the banks formed through the bank forming method according to the invention, where an example of processes of forming a color filter of a liquid crystal display device is shown;

DETAILED DESCRIPTION OF PREFERRED EMBODIMENTS

Figure 1:
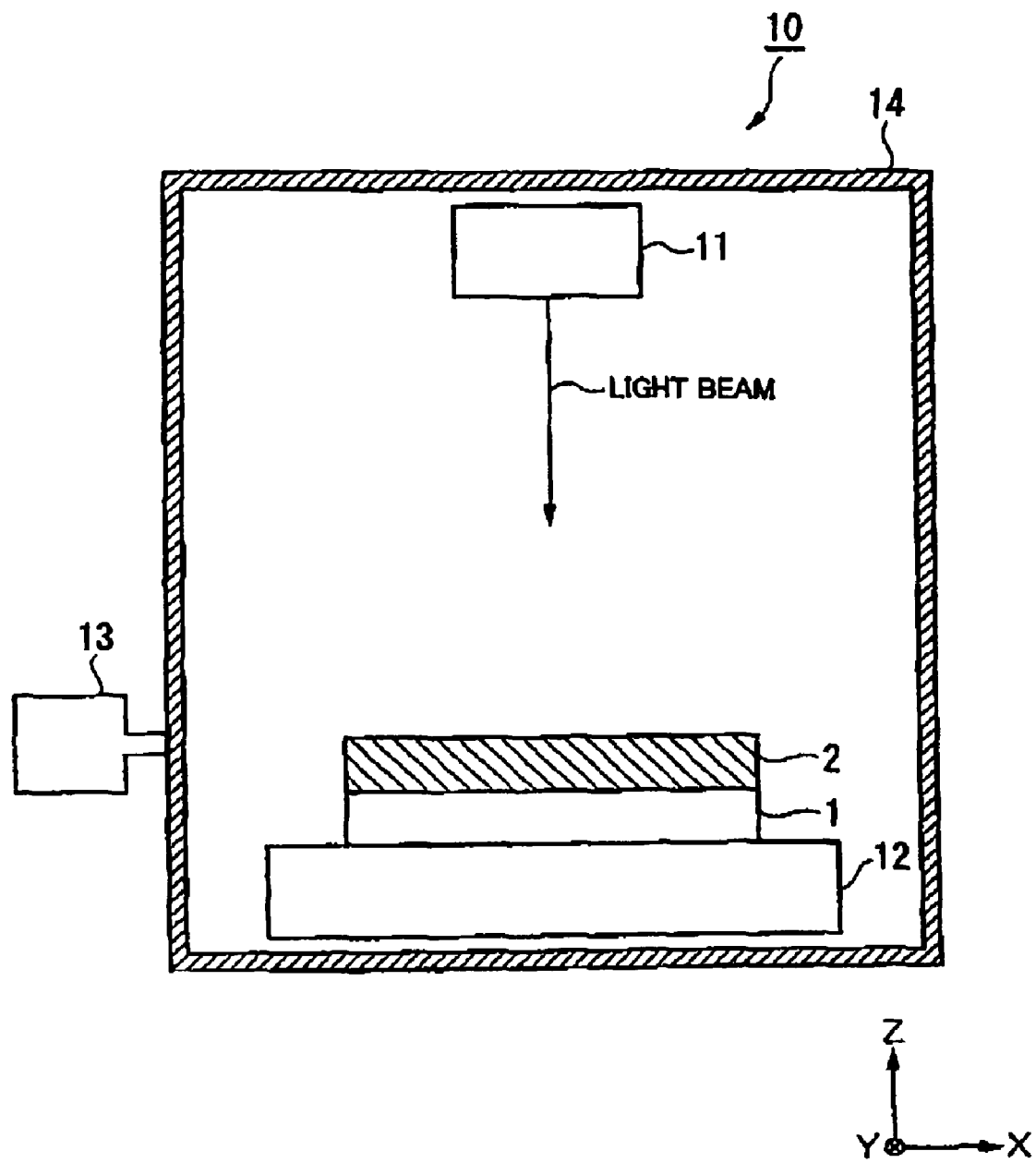
FIG. 1 is a schematic diagram illustrating an exemplary embodiment of a bank forming apparatus used in a bank forming method according to the invention.

Hereinafter, an exemplary bank forming method according to the invention will be described with reference to the accompanying drawings. FIG. 1 is a schematic diagram illustrating an exemplary embodiment of a bank forming apparatus used in the bank forming method according to the invention. In FIG. 1, the bank forming apparatus 10 can include a laser source 11 for radiating a laser beam having a predetermined wavelength and a stage 12 for supporting a base member 1 which is a processing target. A sublimation layer 2 containing a sublimation material is formed on the top surface of the base member 1. The laser source 11 and the stage 12 for supporting the base member 1 are placed within a chamber 14. A suction apparatus 13 for sucking gas inside the chamber 14 is connected to the chamber 14. In this exemplary embodiment, a near-infrared semiconductor laser (with a wavelength of 830 nm) is used as the laser source 11.

In the following description, it is assumed that a predetermined direction in a horizontal plane is an X axis direction, a direction perpendicular to the X axis direction in the horizontal plane is a Y axis direction, and a direction (a vertical direction) perpendicular to the X axis direction and the Y axis direction is a Z axis direction.

The stage 12 is provided to be movable in the X axis direction and the Y axis direction while supporting the base member 1, and the base member 1 is movable with respect to the light beam radiated from the light source 11 through movement of the stage 12. Further, the stage 12 is movable in the Z axis direction. Here, an optical system not shown is disposed between the light source 11 and the base member 1 supported by the stage 12.

The stage 12 supporting the base member 1 can adjust the position of the base member 1 with respect to the focus of the optical system through movement thereof in the Z axis direction. In addition, the light beam radiated from the light source 11 irradiates the base member 1 (sublimation layer 2) supported by the stage 12.

For example, a glass substrate or a transparent polymer can be used as the base member 1. Examples of the transparent polymer may include polyester, such as polyethylene terephthalate, polyacryl, polyepoxy, polyethylene, polystyrene, polycarbonate, polysulfide, etc. When the base member 1 is formed out of the transparent polymer, the thickness thereof is preferably 10 to 500 μm. As a result, for example, the base member 1 can be formed in a belt shape and wound in a roll shape, so that the base member can be carried (moved) while the base member is held on a rotary drum, etc.

On the other hand, although the base member 1 is supported by the stage 12 which is linearly moved in the X and Y axis directions in this exemplary embodiment, the rotary drum can be movable in a horizontal direction (scanning direction, X axis direction), a rotational direction (Y axis direction), and a vertical direction (Z axis direction) while the base member 1 is held on the rotary drum.

Further, the sublimation layer 2 contains a sublimation pigment which is dispersed in a binder resin. The binder may be omitted. As the sublimation material, a well-known sublimation material (sublimation pigment) can be used, and for example, disperse dyes, basic dyes, and oil-soluble dyes disclosed in Japanese Unexamined Patent Application Publication No. 6-99667 or materials disclosed in Japanese Unexamined Patent Application Publication No. 2001-514106 can be used. Examples of a yellow (Y) sublimation material can include azopyridine, dicyanosteel, and quinophthalone, examples of a magenta (M) sublimation material can include anthraquinone, tricyanosteel, and azobenzene, and examples of a cyan (C) sublimation material can include anthraquinone, indophenol, and indonaphthol. Furthermore, the sublimation layer 2 may be formed in one layer or may be formed in two or more layers.

When the binder resin is used in the sublimation layer 2, known binder resins can be used, such as: polyamide resin, polyester resin, polyepoxy resin, polyurethane resin, polyacryl resin (for example, polymethylmethacrylate, polyacrylamide, polystyrene-2-acrylonitrile), vinyl resin such as polyvinylpyrrolidone, polyvinyl chloride resin (for example, vinyl chloride-vinyl acetate copolymer), polycarbonate resin, polystyrene, polyphenylene oxide, cellulose resin (for example, methyl cellulose, ethyl cellulose, carboxymethyl cellulose, cellulose acetate hydrogen phthalate, cellulose acetate, cellulose acetate propionate, cellulose acetate butyrate, cellulose triacetate), polyvinyl alcohol resin (for example, partial-ketone forming poly vinyl alcohol such as poly vinyl alcohol, poly vinyl butyral, etc.), petroleum resin, rosin derivative, coumarone-indene resin, terpene resin, polyolefin resin (for example, polyethylene, polypropylene, etc.), and the like.

As an organic solvent for dissolving or dispersing the pigment or the binder resin, a solvent containing monohydric alcohol is used. For example, n-butyl alcohol (b.p. 117.4° C.), isobutyl alcohol (b.p. 108.1° C.), sec-butyl alcohol (b.p. 100° C.), n-amyl alcohol (b.p. 138° C.), isoamyl alcohol (b.p. 132° C.), hexyl alcohol (b.p. 155.7° C.) or the like can be contained in the organic solvent. Another organic solvent other than the alcohols may be mixed and used. As the other organic solvent to be mixed, a well-known solvent may be used, and specifically, ketones such as methyl ethyl ketone, methyl isobutyl ketone, cyclohexanone, etc., aromatics such as toluene, xylene, etc., halogens such as dichloromethane, trichloroethane, etc., esters such as ethyl acetate, propyl butyrate, etc., dioxane, tetrahydrofuran, and mixtures thereof may be included in examples of the other organic solvent to be mixed.

The sublimation layer 2 can be formed on the base member 1 by using a conventional film coating method such as an extrusion coating method, a spin coating method, a gravure coating method, a reverse roll coating method, a rod coating method, a micro gravure coating method, etc. In the method of coating the sublimation layer 2, it is preferable that the sublimation layer-forming functional solution be uniformly formed on the base member 1 by eliminating static electricity charged on the surface of the base member 1 and it is also preferable that a static eliminator be provided in the apparatus used for each method.

Figure 2A:
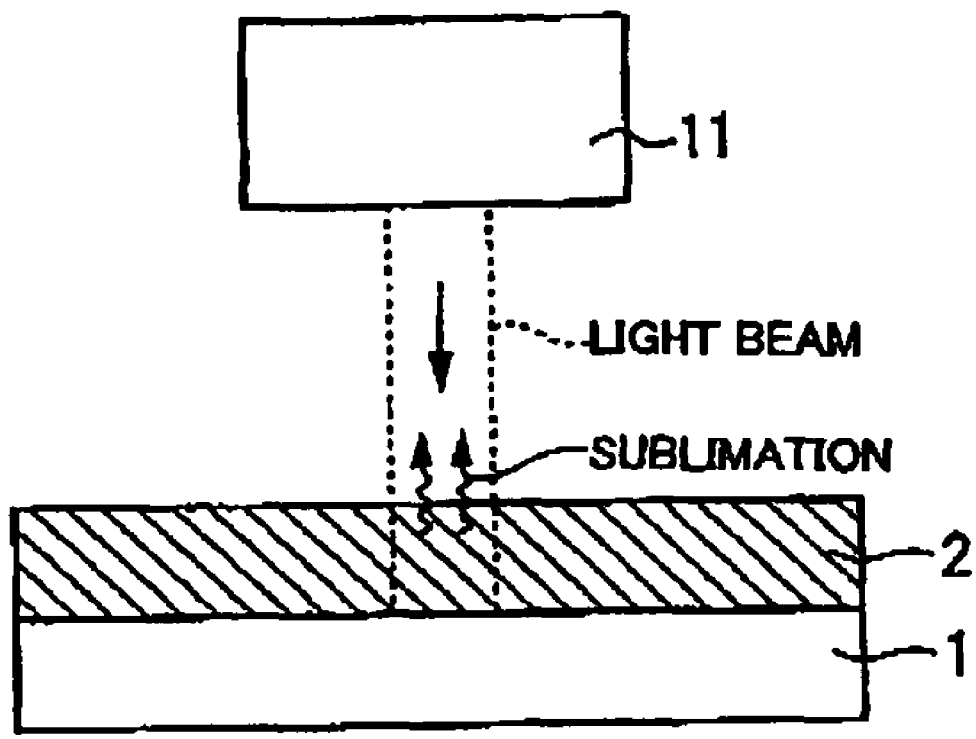
FIG. 2 is a schematic diagram illustrating an exemplary embodiment of the bank forming method according to the invention.
Figure 2B:
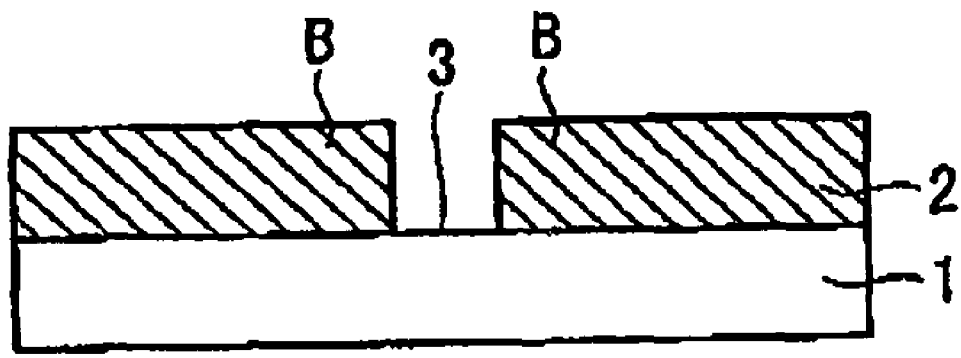

Next, the sequence of forming banks will be described with reference to FIG. 2. As shown in FIG. 2(a), a laser beam having a predetermined beam diameter is radiated from the top side of the sublimation layer 2 on the base member 1. The base member 1 and the sublimation layer 2 on the base member 1 corresponding to the irradiated position are heated through the radiation of the laser beam. The sublimation material of the sublimation layer 2 is sublimated with the heat generated due to the radiated laser beam, and as shown in FIG. 2(b), the sublimation material (sublimation layer 2) corresponding to the irradiated position is removed from the base member 1. As a result, the banks B and B are formed and the base member 1 in the groove 3 between the banks B and B is exposed.

At this time, by moving the stage 12 along the X-Y plane with respect to the laser beam to be radiated, the grooves 3 are drawn correspondingly to the movement trace of the stage 12. As a result, a bank pattern for partitioning off a predetermined area of the base member 1 is formed on the base member 1.

The sublimation material sublimated by the radiation of light or the material separated from the base member 1 along with the sublimation material become suspended inside the chamber 14, but the material separated from the base member 1 can be recovered by driving the suction apparatus 13 and sucking the gas inside the chamber 14 with the suction apparatus. Therefore, it is possible to prevent a disadvantage that the material separated from the base member 1 is attached again to the base member 1 or the grooves 3 or the banks B.

As described above, by radiating the light onto the base member 1 having the sublimation layer 2, the sublimation material can be sublimated with the heat resulting from the radiated light and removed from the base member 1. Therefore, by radiating the light onto areas corresponding to the bank pattern to be formed, the sublimation material in the light-radiation area can be removed and the banks B having a desired pattern can be formed on the base member 1. Further, since the banks B are formed by removing the sublimation material of portions corresponding to the light-radiation area, that is, since the banks B can be formed without performing a conventional transfer process, it is possible to prevent deterioration of the bank shape due to transfer irregularity.

In this exemplary embodiment, the banks B (grooves 3) are drawn on the base member 1 by moving the stage 12 supporting the base member 1. However, the light beam to be radiated may be moved with the base member 1 stopped, and the base member 1 and the light beam may be both moved. Further, when the base member 1 is moved, in place of moving the base member in the X-Y plane with the stage 12, the base member may be moved in a state while the base member is held by the rotary drum as described above.

Further, in the exemplary embodiment, the material layer (sublimation layer) for forming the banks contains the sublimation material and the sublimation material is removed with the thermal energy resulting from the light radiation. However, the material layer for forming the banks may not be the sublimation material, and any material can be used as long as it is a material which can be removed with the radiation of a laser beam.

Furthermore, in this exemplary embodiment, the sublimation material is removed with the thermal energy generated due to the radiated light, thereby forming the banks. However, the thermal energy may be supplied to the base member using, for example, a thermal head and the sublimation material can be removed with the thermal energy.

Figure 3:
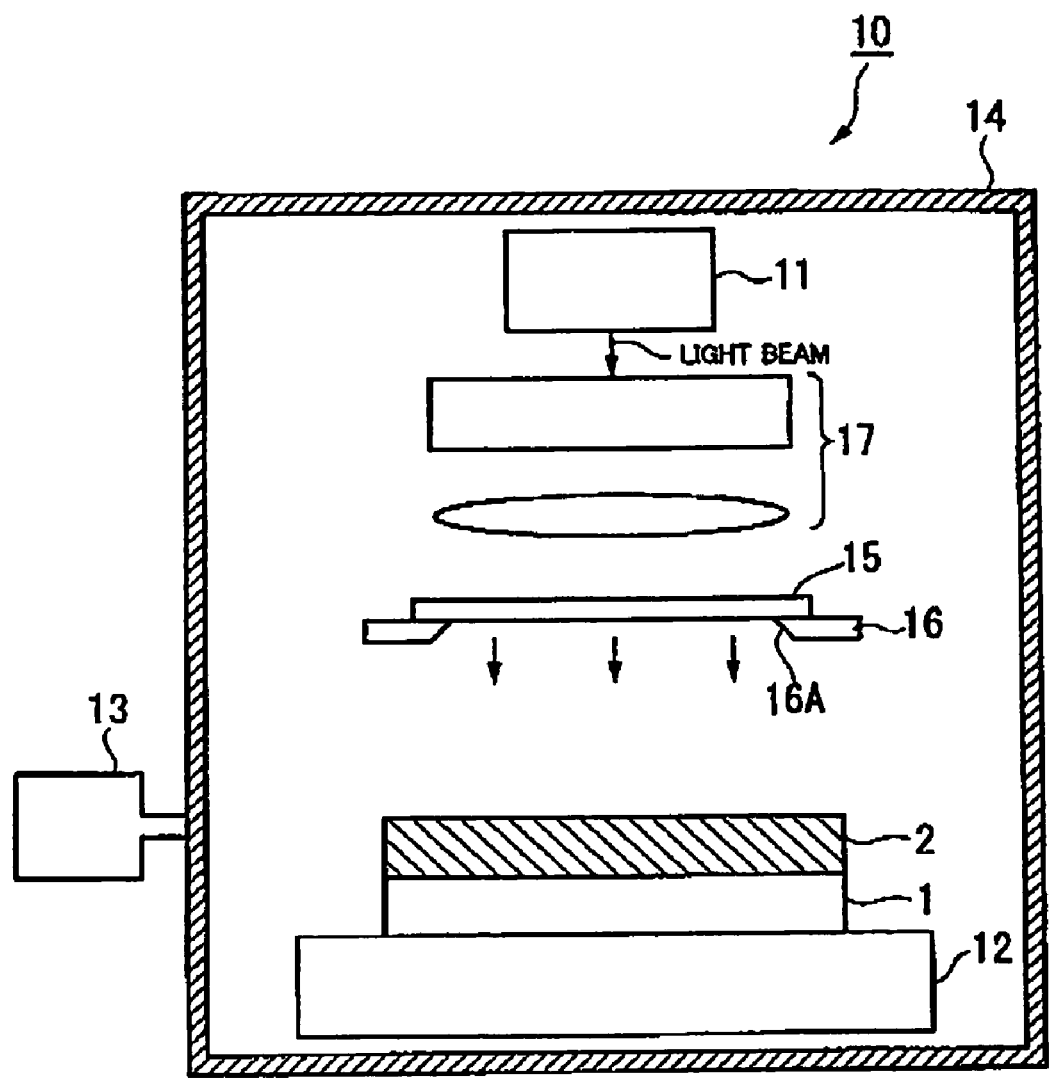
FIG. 3 is a schematic diagram illustrating another exemplary embodiment of the bank forming apparatus used in the bank forming method according to the invention.

When forming the bank patterns, as shown in FIG. 3, a light beam may be radiated to a mask 15 having patterns corresponding to the bank patterns to be formed, thereby radiating the light passing through the mask 15 to the base member 1 (sublimation layer 2). In the example shown in FIG. 3, the mask 15 is supported by a mask support 16 having an opening 16A for transmitting the light passing through the mask 15. The light beam emitted from the light source 11 is converted into illumination light having an illumination distribution through the optical system 17, and then illuminates the mask 15. The light passing through the mask 15 is radiated to the base member 1 (sublimation layer 2) supported by the stage 12, the sublimation material is sublimated due to the heat generated due to the radiated light, and the bank patterns are thus formed. By utilizing the mask 15, the bank patterns smaller than the diameter of the light beam emitted from the laser source 11 can be formed. On the other hand, as described with reference to FIG. 1, by drawing the banks B (grooves 3) while relatively moving the light beam and the base member 1, it is possible to reduce the amount of labor for manufacturing the mask 15.

In the example shown in FIG. 3, the light is radiated to the base member 1 (sublimation layer 2) in a state where the mask 15 and the base member 1 (sublimation layer 2) are separated from each other. However, the light may be radiated to the mask 15 in a state where the mask 15 and the base member 1 (sublimation layer 2) come in close contact with each other, and the light passing through the mask 15 may be radiated to the base member 1 (sublimation layer 2).

Figure 4A:
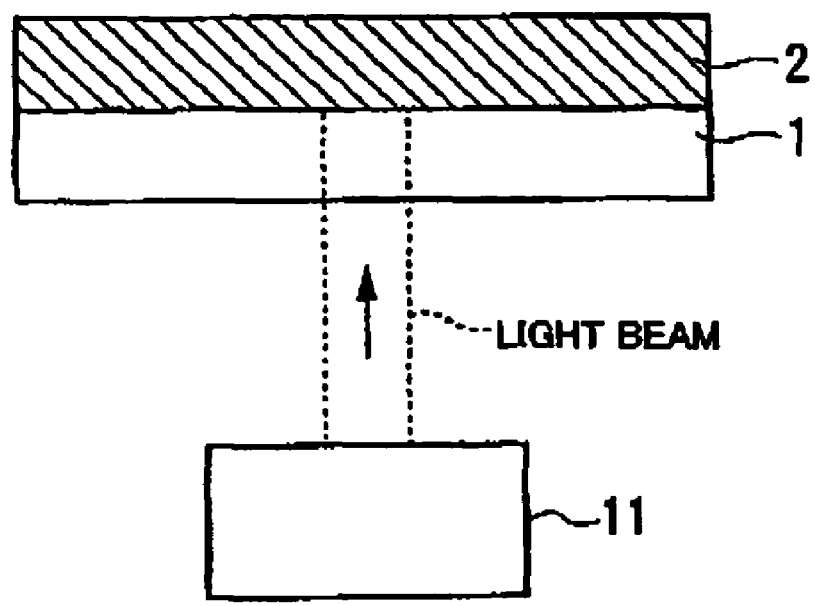
FIG. 4 is schematic diagram illustrating another exemplary embodiment of the bank forming method according to the invention.
Figure 4B:
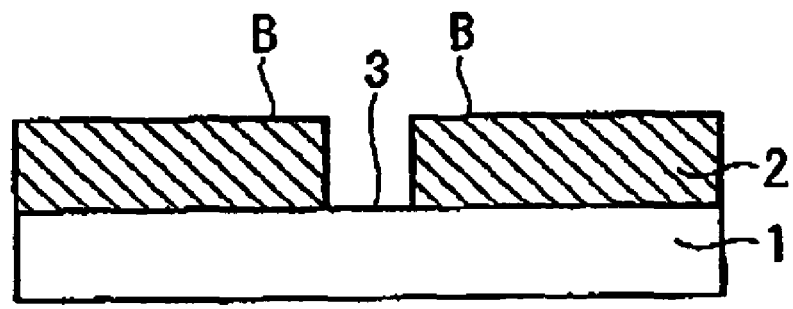

As shown in FIG. 4, the light beam may be radiated to the base member 1 from the back surface side of the base member 1 on which the sublimation layer 2 is not formed. In this case, the base member 1 is made of a transparent material capable of transmitting a light beam. Accordingly, since the sublimation material of the sublimation layer 2 can be also heated by radiated light, the sublimation material (sublimation layer 2) positioned at the light-radiated position can be removed, thereby forming the banks B. In a case where the light is radiated to the sublimation layer 2 through the base member 1 from the back surface side of the base member 1, the light may be scattered (diffracted) while passing through the base member 1. Therefore, it is preferable that the scattering condition be measured in advance and the light be radiated from the back surface side of the base member 1 while adjusting the radiation condition on the basis of the measurement result to allow the light to be radiated to the desired positions of the sublimation layer 2. Furthermore, the light may be radiated from both the surface side and the back surface side of the base member 1.

Figure 5A:
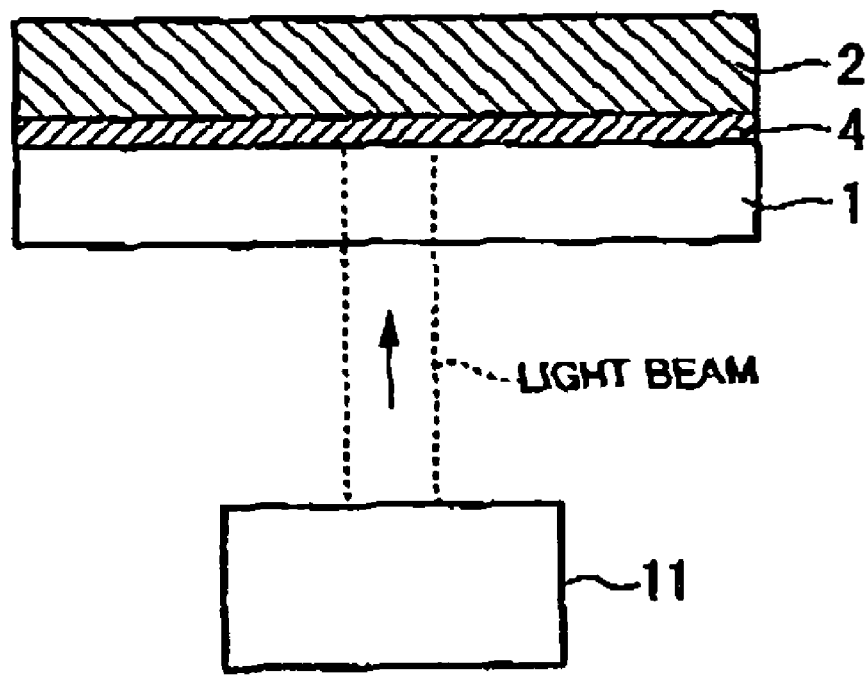
FIG. 5 is a schematic diagram illustrating another exemplary embodiment of the bank forming method according to the invention.
Figure 5B:
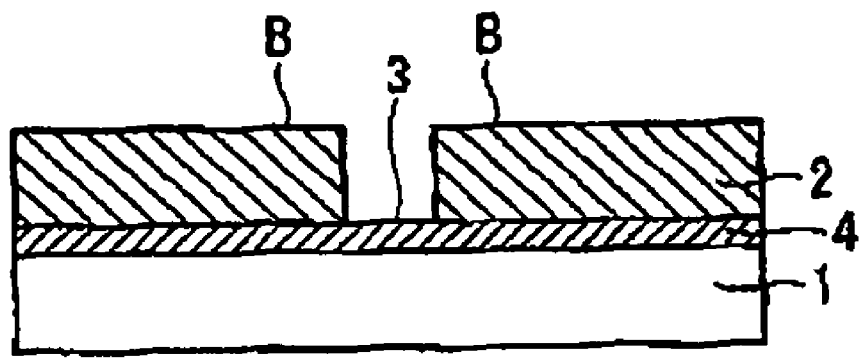

As shown in FIG. 5(a), a photothermal conversion layer 4 containing a photothermal conversion material for converting the optical energy into the thermal energy may be provided between the base member 1 and the sublimation layer 2. As a result, the optical energy of the radiated laser beam can be efficiently converted into the thermal energy, and as shown in FIG. 5(b), the sublimation material of the sublimation layer 2 adjacent to the photothermal conversion layer 4 can be sublimated well. Furthermore, the photothermal conversion layer 4 may be provided at the back surface side of the base member 1 on which the sublimation layer 2 is not formed.

Known materials can be used as the photothermal conversion material constituting the photothermal conversion layer 4, and it is not specifically limited if only the material can efficiently convert the laser beam into the heat. Examples of the photothermal conversion layer can include a metal layer made of aluminum, oxide thereof and/or sulfide thereof, an organic layer made of polymer to which carbon black, graphite, or infrared absorbing pigment is added, and the like. Examples of the infrared absorbing pigment can include anthraquinone, dithiol nickel complex, cyanine, azocobalt complex, di-immonium, squalelium, diphthalocyanine, naphthalocyanine, etc. By using synthetic resin, such as epoxy resin as a binder and dissolving or dispersing the photothermal conversion material in the binder resin, the photothermal conversion material is provided on the base member 1. Of course, the photothermal conversion material may be provided on the base member 1 without dissolving or dispersing the photothermal conversion material in the binder.

When the metal layer is used as the photothermal conversion layer 4, the metal layer can be formed on the base member 1 by using a vacuum deposition method, an electro beam deposition method, or a sputtering method. When the organic layer is used as the photothermal conversion layer 4, the organic layer can be formed on the base member 1 by using conventional film coating methods, such as an extrusion coating method, a spin coating method, a gravure coating method, a reverse roll coating method, a rod coating method, a micro gravure coating method, a knife coating method, etc.

Here, as shown in FIG. 5(*a*), when the photothermal conversion layer 4 is provided between the base member 1 and the sublimation layer 2, it is preferable that the light be radiated from the back surface side of the base member 1. As a result, since the radiated light can be applied directly to the photothermal conversion layer 4, the optical energy of the radiated light can be smoothly converted into the thermal energy, thereby sublimating the sublimation material of the sublimation layer 2 with the thermal energy.

On the other hand, also by radiating the light from the surface side of the base member 1, the optical energy of the radiated light can be converted into the thermal energy in the photothermal conversion layer 4, thereby sublimating the sublimation material of the sublimation layer 2 with the thermal energy. Furthermore, by providing the photothermal conversion layer 4 between the base member 1 and the sublimation layer 2 and allowing the sublimation layer 2 to be opened (exposed) externally, the sublimation material can be smoothly discharged (sublimated) externally.

When the photothermal conversion layer 4 is provided, it is preferable that the light having the wavelength corresponding to the photothermal conversion material be radiated. That is, since wavelength bands of light to be well absorbed are different for each used photothermal conversion material, the optical energy can be efficiently converted into the thermal energy by radiating the light having a wavelength band corresponding to the photothermal conversion material. That is, the photothermal conversion material to be used is selected correspondingly to the radiated light beam. In this exemplary embodiment, since a near-infrared semiconductor laser (wavelength: 830 nm) is used as the laser source, it is preferable that a material having a property of absorbing the light of infrared ray through visible ray regions be used as the photothermal conversion material.

In the exemplary embodiment described with reference to FIG. 5, the photothermal conversion material is provided in a layer (photothermal conversion layer 4) independent from the base member 1 and the sublimation layer 2. However, the photothermal conversion material may be mixed into the base member 1 and the photothermal conversion material may be mixed into the sublimation layer 2. Also in this construction, the optical energy of the radiated laser beam can be converted into the thermal energy, and the thermal energy can be supplied to the sublimation material. In a case where the photothermal conversion material is mixed into the sublimation layer 2, since the photothermal conversion material is separated (removed) from the base member 1 together with the sublimation material through the light radiation, it is possible to suppress influence of the photothermal conversion material on the subsequent processes and also to improve the degree of freedom in designing a device. Specifically, in a case where the base member 1 is applied to a display device, such as an organic EL display device, there may occur a disadvantage that the remaining photothermal conversion layer 4 affects the displayed colors, but this disadvantage can be avoided by mixing the photothermal conversion material into the sublimation layer 2 and removing the photothermal conversion material together with the sublimation material.

On the other hand, as in the exemplary embodiment shown in FIG. 5, in a case where the photothermal conversion layer 4 containing the photothermal conversion material and the sublimation layer 2 are provided separately, the photothermal conversion layer 4 may remain on the base member 1 after the light has been radiated. However, for example, by arranging a functional solution containing a material, which exhibits conductivity by a heat treatment or an optical treatment, in the grooves 3 between the banks B and B in which the photothermal conversion layer 4 remains and radiating the light onto the photothermal conversion layer 4 from the back surface side of the base member 1, the material can be allowed to exhibit the conductivity with the heat generated from the photothermal conversion layer 4. Here, examples of the material exhibiting the conductivity by the heat treatment or the optical treatment can include organic silver compound, etc.

In the case where the photothermal conversion material is mixed into the sublimation layer 2, it is preferable that the light be radiated from the surface side of the base member 1 on which the sublimation layer 2 is provided, because the optical energy can be supplied directly to the photothermal conversion material. Furthermore, since the disadvantage of the scattering (diffraction) of light resulting from passing through the base member 1 does not occur, the radiation of light from the surface side is more preferable compared with the radiation of light from the back surface side.

An adjusting material for adjusting the affinity for liquid may be mixed into the sublimation layer 2. For example, by mixing the adjusting material for adjusting the affinity for liquid into the functional solution for forming the sublimation layer in advance and then applying the functional solution onto the base member 1, the sublimation layer 2 into which the adjusting material is mixed can be formed on the base member 1.

Examples of the adjusting material can be materials having a lyophobic property, such as fluorine-containing compound or silicon compound. As a result, the lyophobic property can be given to the banks B formed of the sublimation layer 2. By giving the lyophobic property to the banks B, for example, when the functional solution is arranged in the vicinity of the top surfaces of the banks B in a case where the functional solution is arranged in the grooves 3 between the banks B and B using the liquid droplet ejecting method, the functional solution can be allowed to flow down and be arranged in the grooves 3 between the banks B and B due to the lyophobic property, so that the functional solution can be arranged in a desired condition.

Examples of the fluorine-containing compound can include monomer, oligomer and polymer containing fluorine atoms inside molecules, fluorine-containing surface active agent, and so on. It is preferable that the fluorine-containing compound be phase-dissolved or dispersed in the binder resin contained in the sublimation layer 2. Examples of the silicon compound can include resin, rubber, surface active agent, coupling agent, and so on containing organic poly siloxane as a major component. Both the fluorine-containing compound and the silicon compound may be mixed into the sublimation layer 2 and any one thereof may be mixed into the sublimation layer 2.

Figure 6A:
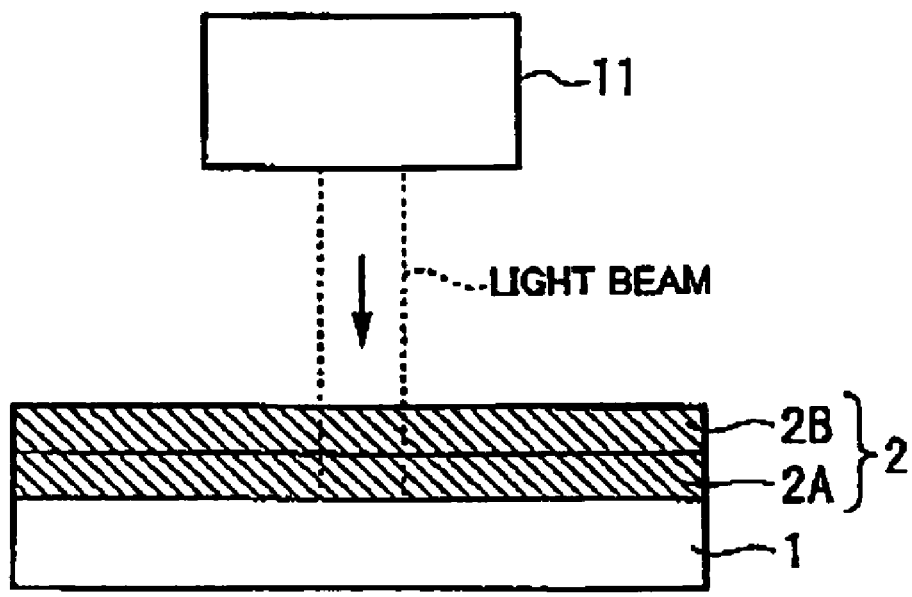
FIG. 6 is a schematic diagram illustrating another exemplary embodiment of the bank forming method according to the invention.
Figure 6B:
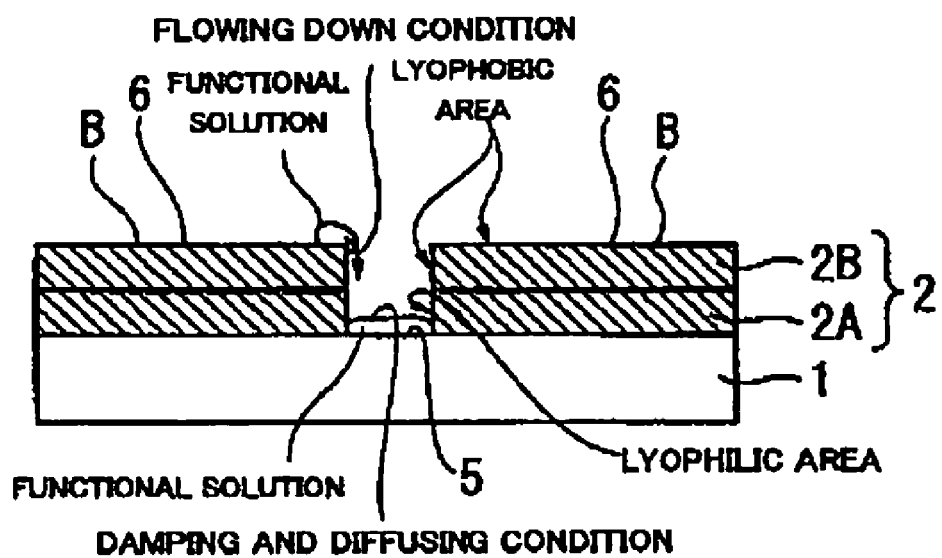

As shown in FIG. 6(a), a plurality of sublimation layers 2A, and 2B having different affinities for liquid (functional solution) may be stacked. As a result, it is possible to control the position or the damping and diffusing condition of the functional solution to be arranged in a desirable state. Specifically, by stacking the sublimation layer 2A and the sublimation layer 2B having a more lyophobic property than that of the sublimation layer 2A on the base member 1 in this order, for example, when the banks are formed and then the functional solution is arranged in the grooves between the banks B and B, as shown in FIG. 6(b), the functional solution can be diffused well in the vicinity of the bottoms 5 of the grooves 3 between the banks B and B, and even when the functional solution is arranged in the vicinity of the top surfaces 6 of the banks B and B, the functional solution in the vicinity of the top surfaces can be caused to flow down and be arranged in the bottoms 5 of the grooves 3 between the banks B and B due to the lyophobic area of the tops.

In order to make the lyophobic properties of the sublimation layers 2A and 2B different, for example, a quantity of the adjusting material (fluorine-containing compound or silicon compound) mixed into the respective sublimation layers 2A and 2B may be made different, or the adjusting material having a lyophilic property may be mixed into the sublimation layer 2A.

In the example shown in FIG. 6, the sublimation layer 2A is provided directly on the base member 1, but the photothermal conversion layer 4 may be provided between the sublimation layer 2A and the base member 1. Further, in the example shown in FIG. 6, two sublimation layers 2A and 2B are stacked, but three or more sublimation layers may be stacked.

Furthermore, between the base member 1 and the sublimation layer 2, a gas generating layer containing a gas generating material, generating gas through the radiation of light or the application of heat, may be provided. When the gas generating material absorbs the light or absorbs the thermal energy converted from the optical energy, the gas generating material causes a decomposing reaction and emits nitrogen gas or hydrogen gas, and supplies energy for removing the sublimation layer 2 with the generated gas. Examples of the gas generating material may include one or more materials selected from a group consisting of pentaerythritol tetranitrate (PETN) and trinitrotoluene (TNT).

In the case where the photothermal conversion layer 4 is provided, an intermediate layer for making uniform the photothermal conversion operation of the photothermal conversion layer 4 may be provided between the photothermal conversion layer 4 and the sublimation layer 2. Examples of the intermediate layer forming material may include a resin material satisfying the above requirement. The intermediate layer can be formed by applying a resin composite having a predetermined composition to the surface of the photothermal conversion layer 4 by using a known coating method, such as a spin coating method, a gravure coating method, a die coating method, etc. and drying the resin composite. When the laser beam is radiated, the optical energy is converted into the thermal energy with operation of the photothermal conversion layer 4, and the thermal energy is made uniform with operation of the intermediate layer. Therefore, the uniform thermal energy is given to the sublimation layer 2 corresponding to the light radiated area.

By using a sheet made of polyethylene terephthalate (PET) as the base member 1, the photothermal conversion layer 4 is provided on the PET sheet and the sublimation layer 2 is provided on the photothermal conversion layer 4. Then, the sheets are held in a rotary drum, and a laser beam having a wavelength of 830 nm is radiated to the sheet from a near-infrared semiconductor laser having an output power of 11 W while rotating the rotary drum at 130 rpm. Accordingly, the sublimation pigment of the sublimation layer 2 is lost. Then, by measuring a contact angle to tetradecane, it is checked whether the sublimation material of the area corresponding to the light-radiated area is removed or not. The contact angle of the sublimation layer 2 to tetradecane before the light radiation is 49 degrees, but the contact angle of the sublimation pigment lost area after the light radiation is 7 degrees, whereby it can be confirmed that a part of the sublimation layer 2 through the laser beam radiation is lost.

Figure 7:
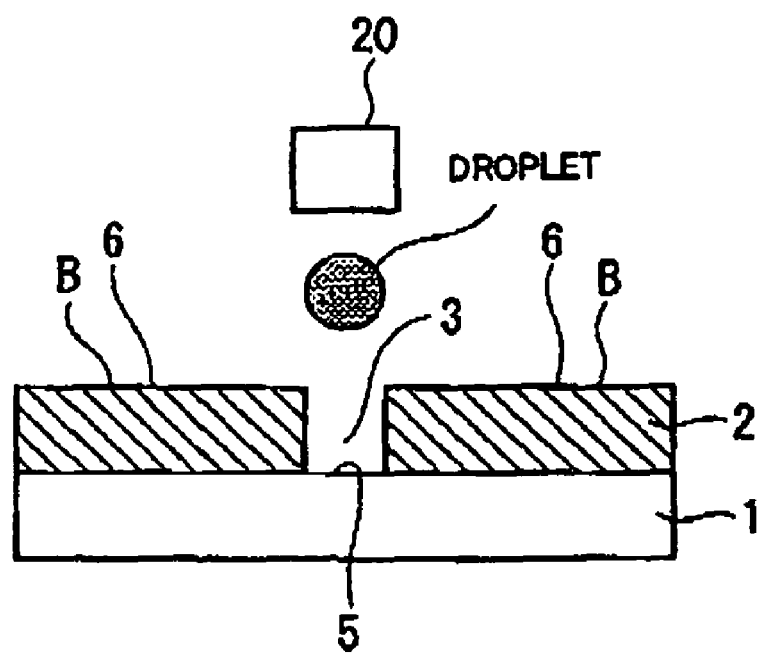
FIG. 7 is a schematic diagram illustrating an exemplary embodiment of a wiring pattern forming method according to the invention.

Now, a method of forming a wiring pattern on the base member 1 using the banks B and B formed through the aforementioned method will be described. FIG. 7 is a schematic diagram illustrating the method of forming a wiring pattern on the base member 1 using the formed banks B. In this exemplary embodiment, in order to arrange the wiring pattern forming material on the base member 1, the liquid droplet ejecting method (inkjet method) of ejecting liquid droplets of a functional solution containing the wiring pattern forming material is used. The banks B are provided on the base member 1 to partition a predetermined wiring pattern forming area. In the liquid droplet ejecting method, the liquid droplets of the functional solution containing the wiring pattern forming material can be ejected to the grooves 3 between the banks B and B from the ejecting head 20, in a state where the ejecting head 20 and the base member 1 are opposed each other.

Here, examples of the ejection techniques used for the liquid droplet ejecting method may include an electrification control method, a pressurized vibration method, an electrothermal conversion method, an electrostatic attraction method, an electromechanical conversion method, and so on. In the electrification control method, electric charges are given to the material with the electrification electrode, a flying direction of the material is controlled with a deflecting electrode, thereby ejecting the material from the ejecting nozzles. Further, in the pressurized vibration method, an ultra high pressure of about 30 kg/cm$^2$ is applied to the material, thereby ejecting the material to the front end side of the nozzles. Here, when the control voltage is not applied, the material goes straight ahead and is ejected from the ejecting nozzles, and when the control voltage is applied, electrostatic repulsion occurs, the material flies in all directions, and the material is not ejected from the ejecting nozzles. In the electrothermal conversion method, the material is rapidly vaporized to generate bubbles with a heater provided in a space in which the material is stored, and thus the material in the space is ejected by the pressure of bubbles. In the electrostatic attraction method, electrostatic attraction is applied to take out the material in a state where meniscuses of the material is formed in the ejecting nozzles by applying a small pressure to a space in which the material is stored. The electromechanical conversion method uses a feature of a piezoelectric element which is deformed with electrical pulse signals, where a pressure is applied to the space storing the material through a flexible material by means of deformation of the piezoelectric element and the material is extruded from the space, thereby ejecting the material from the ejecting nozzles. In addition, a technique of utilizing variation in viscosity of fluid due to an electric field, or a technique of allowing the material to fly with discharged sparks may be employed. The liquid droplet ejecting method has advantages that the waste of material is small and a desired amount of material can be accurately arranged at a desired position. An amount of a droplet of a liquid material to be ejected in the liquid droplet ejecting method may be, for example, 1 to 300 ng. In this exemplary embodiment, the electromechanical conversion method (piezoelectric method) is employed.

Figure 8:
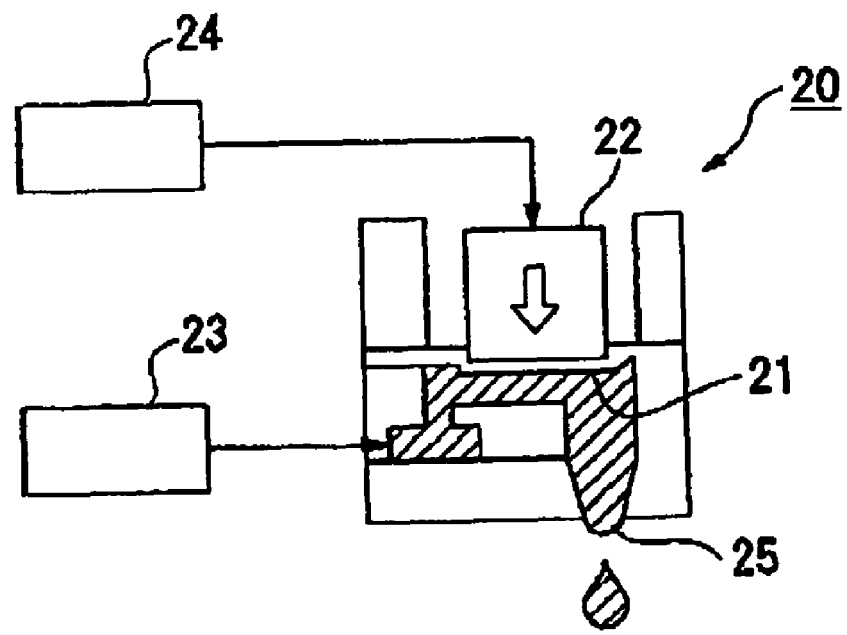
FIG. 8 is a schematic diagram illustrating an ejecting head used in the wiring pattern forming method according to the invention.

FIG. 8 is a diagram illustrating a principle of ejecting a functional solution (liquid material) using the piezoelectric method.

In FIG. 8, the ejecting head 20 can include a liquid chamber 21 for receiving a functional solution (liquid material containing the wiring pattern forming material) and a piezoelectric element 22 provided adjacent to the liquid chamber 21. The liquid chamber 21 is supplied with the functional solution through a supply system 23 including a material tank for storing the functional solution. The piezoelectric element 22 is connected to a driving circuit 24. By applying a voltage to the piezoelectric element 22 through the driving circuit 24 and deforming the piezoelectric element 22, the liquid chamber 21 is deformed, thereby ejecting the functional solution from the ejecting nozzles 25. In this case, by changing the value of the applied voltage, the deformation amount of the piezoelectric element 22 is controlled. Further, by changing a frequency of the applied voltage, the deformation speed of the piezoelectric element 22 is controlled. In the ejection of liquid droplets using the piezoelectric method, there is an advantage that the composition of material is not affected well, because heat is not applied to the material.

Now, a process of forming a wiring pattern will be described. After forming the banks B and B using the aforementioned method, first, it is preferable that a residual treatment of removing residuals in the bottoms 5 (exposed portion of the base member 1) of the grooves 3 between banks B and B be performed. In the residual treatment, light, such as ultraviolet (UV) ray, etc. is radiated to the bottoms 5 of the grooves 3, and the residuals, specifically, organic residuals, remaining in the bottoms 5 can be removed by the light excitation. Furthermore, when the photothermal conversion layer 4 is made of an organic material, the photothermal conversion layer 4 of the bottoms 5 can be removed by radiating the light, such as ultraviolet ray, etc. to the bottoms 5 (photothermal conversion layer 4). Furthermore, in the residual treatment, the residuals can be removed through an $O_2$ plasma process, for example, using a process gas containing oxygen ($O_2$) as a predetermined process gas. The ultraviolet radiation process or the $O_2$ plasma process serves as a lyophilic process of giving a lyophilic property to the bottoms 5 (the exposed portion of the base member 1). Accordingly, by giving a lyophilic property to the bottoms 5 (the exposed portion of the base member 1), the functional solution can be diffused well in the bottoms 5 when the droplets of the functional solution are arranged in the grooves 3 as described later.

Subsequently, by performing the lyophobic process to the banks B, a lyophobic property is given to the surfaces of the banks. In the lyophobic process, for example, a plasma processing method ($CF_4$ plasma processing method) using tetrafluoro methane as a process gas in the atmosphere may be employed. It should be understood that the process gas is not limited to the tetrafluoro methane ($CF_4$), but may employ another fluorocarbon gas. A process gas other than fluorine gas may be employed as long as it can give a lyophobic property to the functional solution. Further, in the lyophobic process, various known methods, such as a method (a self-organizing film method, a chemical vapor deposition method) of processing a target with FAS (fluoroalkylsilane), a conjugated plating method, a method of giving a lyophobic property with golden thiol, etc. may be employed. Even when a part of the liquid droplets ejected from the ejecting head 20 are placed on the tops 6 of the banks B, the surfaces of the banks are lyophobic by giving a lyophobic property to the banks B, so that the liquid droplets escape from the banks B and flow down to the grooves 3 between the banks B and B. Therefore, the ejected functional solution is disposed between the banks B and B on the base member 1.

In addition, the lyophobic process to the banks B and B may affect the bottoms 5 (exposed portions of the base member 1) between the banks having been subjected to the lyophilic process in advance. However, in the case where the base member 1 is made of glass, etc., fluorine group is not introduced due to the lyophobic process, so that the base member 1 does not substantially lose a lyophilic property. Further, as described above, by mixing the adjusting material having a lyophobic property into the banks B (sublimation layer 2) in advance, the lyophobic process may be omitted.

Next, a material arrangement process of arranging the liquid droplets of the functional solution containing the wiring pattern forming material between the banks B and B on the base member 1 is performed using the ejecting head 20. Here, an organic silver compound is used as a conductive material constituting the wiring pattern forming material, and the functional solution containing the organic silver compound is ejected using diethylene glycol diethyl ether as a solvent (dispersion medium). In the material arrangement process, as shown in FIG. 7, the liquid droplets of the functional solution containing the wiring pattern forming material are ejected from the ejecting head 20. The ejected liquid droplets are arranged in the grooves 3 between the banks B and B on the substrate P. At that time, since the wiring pattern forming areas to which the liquid droplets are ejected are partitioned by the banks B, it is possible to prevent the liquid droplets from being diffused outside the predetermined positions. Since a lyophobic property is given to the banks B and B, a part of the ejected liquid droplets placed on the banks B flows down to the grooves 3 between the banks. Furthermore, since a lyophilic property is given to the bottoms 5 of the grooves 3 through which the base member 1 is exposed, the ejected liquid droplets are more easily diffused to the bottoms 5, whereby the functional solution is arranged uniformly in the predetermined positions.

Furthermore, as the functional solution, a dispersion liquid in which conductive fine particles are dispersed in a dispersion medium may be used. As the conductive fine particles, for example, metal fine particles including at least one of gold, silver, copper, aluminum, palladium, and nickel, oxide thereof, and fine particles of conductive polymer or superconductor may be used. The dispersion medium is not specifically limited as long as it can disperse the conductive fine particles and does not cause aggregation. Examples of the dispersion medium may include water, alcohol, such as methanol, ethanol, propanol, butanol, etc., hydrocarbon compound such as n-heptane, n-octane, decane, dodecane, tetradecane, toluene, xylene, cymene, durene, indene, dipentene, tetrahydro naphthalene, decahydro naphthalene, cyclohexyl benzene, etc., ether compound such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc., polar compound such as propylene carbonate, γ-butyrolactone, N-methyl-2-pyrrolidone, dimethyl formamide, dimethyl sulfoxide, cyclohexanone, etc., and so on. Among the above compounds, from the view point of a dispersing property of fine particles, a stability of a dispersion liquid, and an easy application to the liquid droplet ejecting method, water, alcohol, hydrocarbon compound, and ether compound are preferable as the dispersion medium, and water and hydrocarbon compound are more preferable as the dispersion medium.

A firing process is performed after the material arrangement process (liquid droplet ejecting process). The conductivity is obtained by performing the firing process to the function solution containing the conductive material. Specifically, the organic silver compound exhibits conductivity by performing the firing process to remove the organic component and allow silver particles to remain. For this reason, at least one of the thermal treatment or the optical treatment as the firing process is performed to the base member 1 having been subjected to the material arrangement process. The thermal treatment or the optical treatment is generally performed in the atmosphere, but may be performed in an inert gas atmosphere of nitrogen, argon, helium, etc. as needed. The process temperature of the thermal treatment or the optical treatment is properly determined considering a boiling point (vapor pressure) of the solvent, a kind or pressure of the atmospheric gas, a dispersion property of the fine particles, thermal behaviors such as oxidation of the organic silver compound, existence or quantity of the coated material, an allowable temperature limit of the base member, and so on. For example, in order to remove the organic components of the organic silver compound, it is necessary to perform the firing process at a temperature of about 200° C. Further, when a substrate made of plastic, etc. is used, it is preferable that the firing process be performed at a temperature higher than the room temperature and lower than 100° C. The conductive material (organic silver compound) having been subjected to the ejection process is converted into conductive wiring patterns due to the remaining silver particles.

An intermediate dry process (or firing process) is performed after the material arrangement process, and by alternately repeating the material arrangement process and the intermediate dry process (firing process) several times, the wiring pattern forming material can be stacked between the banks B and B.

After the firing process, the banks B existing on the base member 1 may be removed (subjected to an ashing process). For example, by radiating a laser beam onto the banks B (sublimation layer 2) or cleaning the banks with a predetermined solvent, the banks B can be removed from the base member 1. As the ashing process, a plasma ashing or ozone ashing may be employed.

Figure 9:
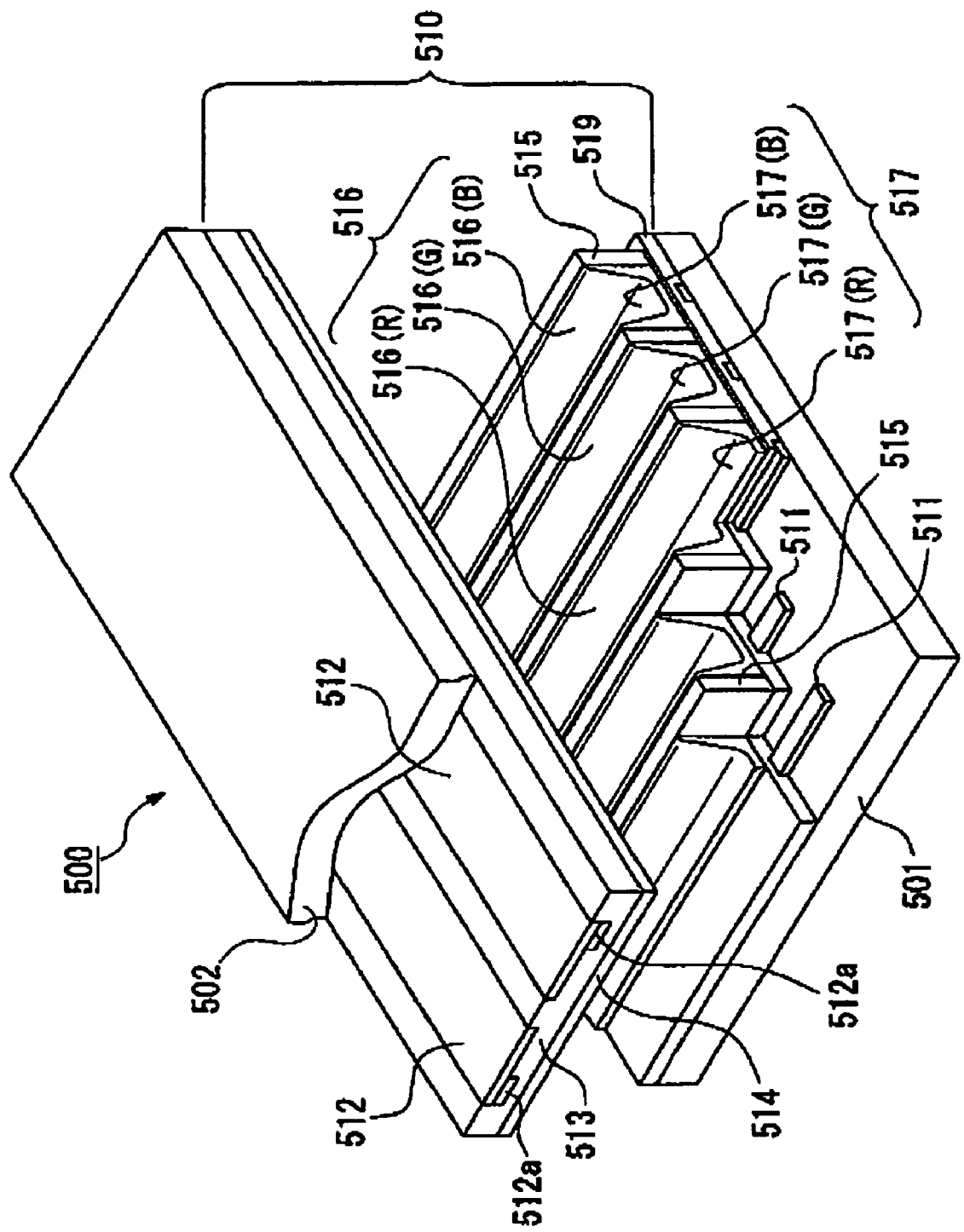
FIG. 9 is an exploded perspective view of a plasma display device illustrating an example of an electro-optical device having the wiring patterns formed using the wiring pattern forming method according to the invention.

Next, as an example of an electro-optical device having the wiring patterns formed using the wiring pattern forming method according to the invention, a plasma display device will be described with reference to FIG. 9. FIG. 9 is an exploded perspective view illustrating the plasma display device 500 of which address electrodes 511 and bus electrodes 512a are manufactured. The plasma display device 500 can include a glass substrate 501 and a glass substrate 502 opposed to each other and a discharge display unit 510 formed between the glass substrates.

The discharge display unit 510 includes a plurality of discharge chambers 516, and a group consisting of three discharge chambers 516 of a red discharge chamber 516(R), a green discharge chamber 516(G), and a blue discharge chamber 516(B) of the plurality of discharge chambers 516 forms one pixel. The address electrodes 511 are formed in a stripe pattern at a predetermined interval on the top surface of the (glass) substrate 501, a dielectric layer 519 is formed to cover the address electrodes 511 and the top surface of the substrate 501, and partitioning walls 515 are formed along the address electrodes 511 to be arranged between the address electrodes 511 and 511 on the dielectric layer 519. The partitioning walls 515 are divided at a predetermined interval in a direction perpendicular to the address electrodes 511 at predetermined positions of the longitudinal direction (not shown), and rectangular areas are formed basically by the partitioning walls adjacent to both widthwise sides of the address electrodes 511 and the partitioning walls extending in the direction perpendicular to the address electrodes 511, so that the discharge chambers 516 are formed to correspond to the rectangular areas and a group of three rectangular areas constitutes a pixel. Fluorescent materials 517 are arranged inside the rectangular areas defined by the partitions 515. The fluorescent materials 517 emit one fluorescent light component of red, green, and blue. The red fluorescent material 517(R) is disposed on the bottom of the red discharge chamber 516(R), the green fluorescent material 517(G) is disposed on the bottom of the green discharge chamber 516(G), and the blue fluorescent material 517(B) is disposed on the bottom of the blue discharge chamber 516(B).

Next, a plurality of transparent display electrodes 512 made of ITO are formed in a stripe pattern at a predetermined interval in the direction perpendicular to the address electrodes 511 on the glass substrate 502 side, and bus electrodes 512a made of metal to assist the high-resistance ITO are also formed together. A dielectric layer 513 is formed to cover the transparent display electrodes and the bus electrodes, and a protective film 514 made of MgO, etc. is formed thereon. Two substrates of the substrate 501 and the substrate 502 are bonded to allow the address electrodes 511, . . . and the display electrodes 512, . . . to be perpendicular each other, and the discharge chambers 516 are formed by exhausting spaces surrounded with the substrate 501, the partitioning walls 515, and the protective film 514 formed on the glass substrate 502 side and injecting rare gas thereto. The display electrodes 512 formed on the glass substrate 502 are arranged two every discharge chamber 516. The address electrodes 511 and the display electrodes 512 are connected to an alternating power source not shown, and the fluorescent materials 517 positioned at required positions in the discharging display unit 510 are excited to emit the fluorescent light by supplying power to the respective electrodes, so that a color display can be performed.

In this example, the address electrodes 511 and the bus electrodes 512a are formed using the wiring pattern forming method according to the invention. The address electrodes 511 and the bus electrodes 512a are formed by ejecting a functional solution in which metal colloid materials (for example, gold colloid or silver colloid) or conductive fine particles (for example, metal fine particles) are dispersed and drying and burning the functional solution, because it is advantageous for patterning. The fluorescent materials 517 can be formed by ejecting with the ejection head 20 a functional solution obtained by dissolving the fluorescent material in a solvent or dispersing the fluorescent material in a dispersion medium and drying and burning the functional solution.

Next, a process of manufacturing a color filter of a liquid crystal display device using the banks according to the invention will be described with reference to FIG. 10. First, as shown in FIG. 10(a), black matrices (banks) 52 are formed on one surface of a transparent substrate (base member) P. The black matrices 52 partition color filter forming areas and are formed using the bank forming method according to the invention. By using black material as the sublimation material and mixing photo-curable resin in the sublimation material when forming the black matrices (banks), the black matrices can be cured through a light radiation process.

Next, as shown in FIG. 10(b), the liquid droplets 54 of a functional solution for forming the color filters from the ejecting head 20 are ejected and the liquid droplets are deposited in filter elements 53. The quantity of the functional solution 54 to be ejected is set to be sufficient in consideration of decrease in volume of the functional solution during the heating process (drying and firing process).

After the liquid droplets 54 are filled in all the filter elements 53 on the substrate P in this way, the substrate P is heated to a predetermined temperature (for example, about 70° C.) using a heater. Through this heating process, the solvent of the functional solution is vaporized and the volume of the functional solution is decreased. When the volume decrease is severe, the liquid droplet ejecting process and the heating process are repeated until a film thickness sufficient for a color filter is obtained. Through this process, the solvent included in the functional solution is vaporized and only solid components (functional material) included in the functional solution finally remains and forms a film, so that the color filters 55 shown in FIG. 10(c) are obtained.

Next, in order to planarize the substrate P and protect the color filters 55, as shown in FIG. 10(d), a protective film 56 is formed to cover the color filters 55 or the black matrices 52 on the substrate P. The protective film 56 can be formed using a spin coating method, a roll coating method, a ripping method, etc., and may be formed using the ejecting apparatus, similarly to formation of the color filters 55. Next, as shown in FIG. 10(e), a transparent conductive film 57 is formed on the whole surface of the protective film 56 using the sputtering method or a vacuum deposition method. Thereafter, the transparent conductive film 57 is patterned to pattern pixel electrodes 58 correspondingly to the filter elements 53, as shown in FIG. 10(f). On the other hand, in the case where TFTs (Thin Film Transistors) are used for driving a liquid crystal display panel, the above patterning process can be omitted. Since the ejecting head 20 is used for manufacturing the color filters, the color filter material can be ejected continuously without any problem, so that it is possible to form the color filters well and to enhance productivity.

Figure 11:
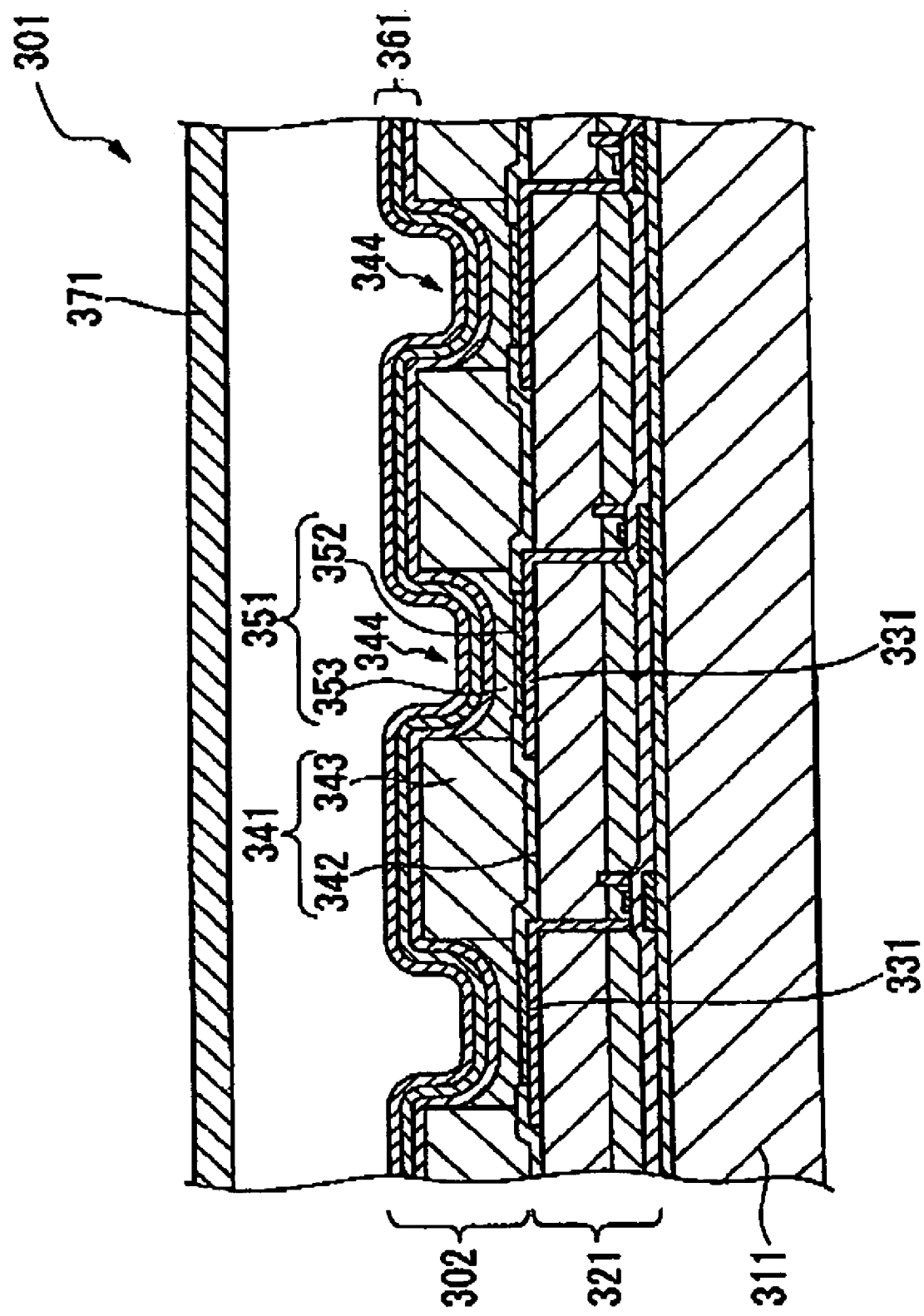
FIG. 11 is a diagram illustrating an example of the electro-optical device manufactured using the banks formed through the bank forming method according to the invention, where an example of a process of forming a side cross-sectional view of an organic EL display device is shown.

Next, a process of manufacturing an organic EL display device using the banks according to the invention will be described with reference to FIG. 11. FIG. 11 is a side cross-sectional view of an organic EL display device of which some constituent elements are formed with the ejecting head 20. First, an approximate structure of the organic EL display device will be described. The organic EL display device to be formed here is an exemplary embodiment of the electro-optical device according to the invention. As shown in FIG. 11, in the organic EL display device 301, an organic EL element section 302 can include a substrate (base member) 311, a circuit element part 321, pixel electrodes 331, banks 341, light-emitting elements 351, a negative electrode 361 (counter electrode) and a sealing substrate 371 is connected to wires of a flexible substrate (not shown) and a driving IC (not shown). The circuit element section 321 is formed on the substrate 311, and a plurality of pixel electrodes 331 are arranged on the circuit element section 321. The banks 341 are formed in a lattice shape between the pixel electrodes 331, and the light-emitting elements 351 are formed in recessed openings 344 generated by the banks 341. The negative electrode 361 is formed on the whole top surface of the banks 341 and the light-emitting elements 351, and the sealing substrate 371 is stacked on the negative electrode 361.

Each bank 341 can include a first bank 342 and a second bank 343 stacked thereon. The banks 341 are formed using the bank forming method according to the invention.

The method can include manufacturing the organic EL display device 301 including the organic EL elements comprises a bank forming process of forming the banks 341, a plasma process of making suitable formation of the light-emitting elements 351, a light-emitting element forming process of forming the light-emitting elements 351, a counter electrode forming process of forming the negative electrode 361, and a sealing process of stacking the sealing substrate 371 on the negative electrode 361 and sealing them.

In the light-emitting forming process, the light-emitting elements 351 are formed by forming hole injection layers 352 and light-emitting layers 353 in the recessed openings 344, that is, on the pixel electrodes 331, and a hole injection forming process and a light-emitting layer forming process are included. The hole injection layer forming process includes a first ejection process of ejecting a first functional solution for forming the hole injection layers 352 onto the pixel electrodes 331 and a first dry process of drying the first functional solution ejected and forming the hole injection layers 352, and the light-emitting layer forming process includes a second ejection process of ejecting a second functional solution for forming the light-emitting layers 353 onto the hole injection layers 352 and a second dry process of drying the second functional solution ejected and forming the light-emitting layers 353.

In the process of forming the light-emitting element, the ejecting head 20 is used in the first ejection process in the process of forming the hole injection layer and the second ejection process in the process of forming the light-emitting layer.

Figure 12A:
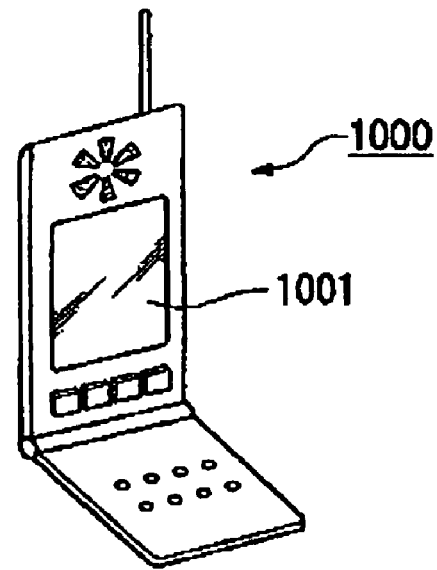
FIG. 12 is a diagram illustrating an example of an electronic apparatus having the electro-optical device according to the invention.
Figure 12B:
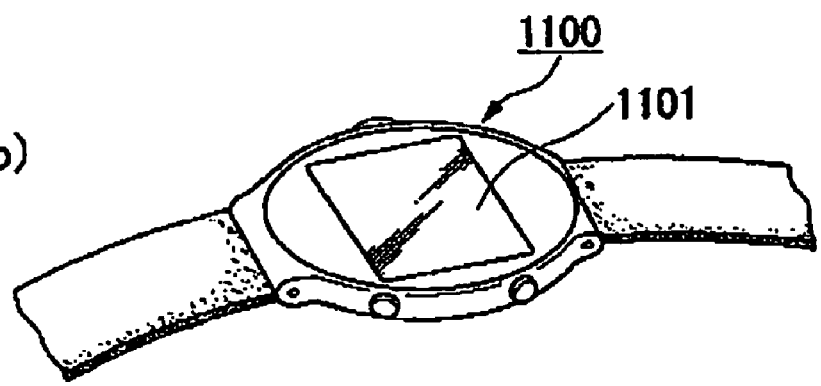
Figure 12C:
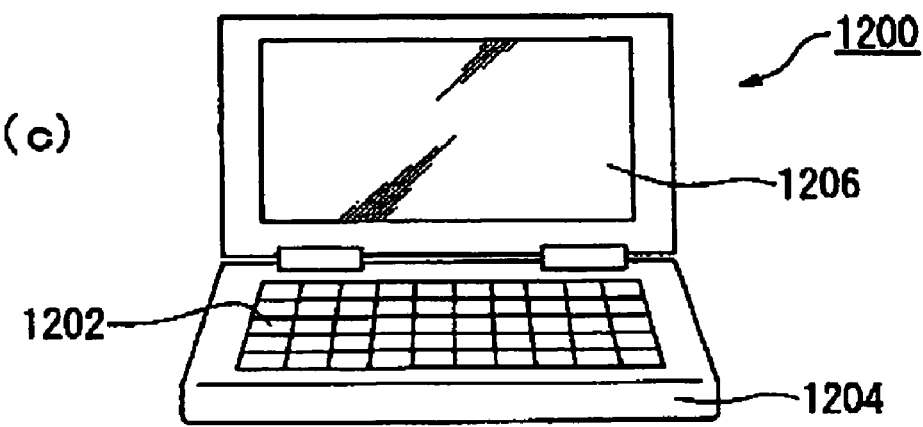

Now, applications of an electronic apparatus including the electro-optical device (a liquid crystal display device, an organic EL display device, plasma display device, etc.) will be described. FIG. 12(a) is a perspective view illustrating an example of a mobile phone. In FIG. 12(a), reference numeral 1000 denotes a mobile phone body, and reference numeral 1001 denotes a display unit employing the electro-optical device. FIG. 12(b) is a perspective view illustrating an example of a wrist watch type electronic apparatus. In FIG. 12(b), reference numeral 1100 denotes a watch body, and reference numeral 1101 denotes a display unit employing the electro-optical device. FIG. 12(c) is a perspective view illustrating an example of a mobile data processing apparatus such as a word processor, a PC, etc. In FIG. 12(c), reference numeral 1200 is a data processing apparatus, reference numeral 1202 denotes an input unit such as a keyboard, reference numeral 1204 denotes a data processing apparatus body, and reference numeral 1206 denotes a display unit employing the electro-optical device. Since the electronic apparatuses shown in FIGS. 12(a) to 12(c) comprise the electro-optical device according to the above exemplary embodiments, an electronic apparatus comprising a display unit with excellent display quality and a bright screen can be embodied.

In addition to the aforementioned examples, examples of the electronic apparatuses can further include a liquid crystal television, a view finder type or monitor direct vision-type video tape recorder, a car navigation apparatus, a pager, an electronic note, a calculator, a word processor, a work station, a television phone, a POS terminal, electronic paper, an apparatus having a touch panel and the like. The electro-optical device of the invention can be also applied to the display unit of the above-mentioned electronic apparatuses.

FIG. 13 is a diagram illustrating an example of processes of forming micro lenses using the banks according to the invention.

Figure 13A:
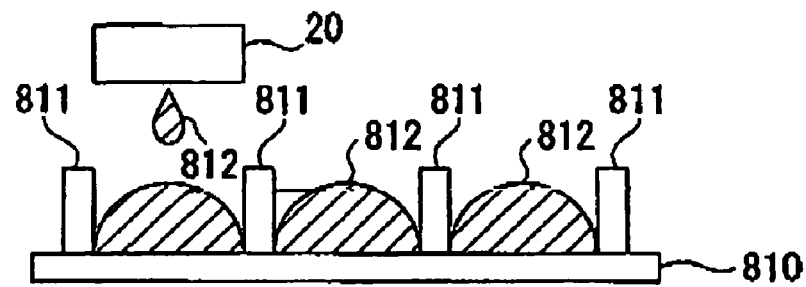
FIG. 13 is a schematic diagram illustrating processes of forming a micro lens using the banks according to the invention.
Figure 13B:
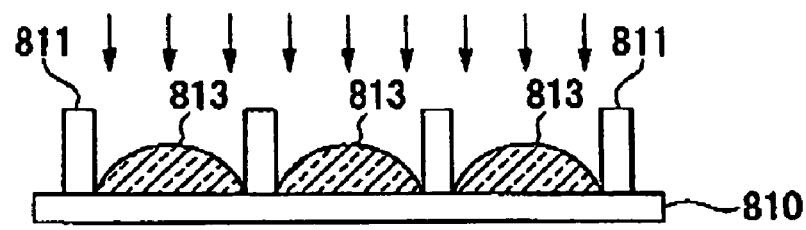

As shown in FIG. 13(a), banks 811 are formed on a base member 810 by using the bank forming method according to the invention. Then, a functional solution 812 containing a lens material is ejected to the grooves between the banks 811 and 811 from the ejecting head 20. As the lens material, transparent material having a high refractive index may be preferably used, and for example, a photo-curable resin, a thermosetting resin, or an inorganic material may be used. In this example, the photo-curable resin is used for the purpose of achieving a decrease in temperature of a curing process. Before the process of ejecting the functional solution 812, it is preferable that the aforementioned lyophobic process be performed to the banks 811. Next, as shown in FIG. 13(b), the lens material 812 arranged on the base member 810 is cured. The curing process is performed by radiating the light of a predetermined wavelength to the lens material. Further, in the case where the thermosetting resin is used as the lens material, the curing process is performed by heating the lens material at a predetermined temperature. Through this curing process, curved lenses 813 having a convex shape are formed in the areas partitioned by the banks 811.

Figure 14:
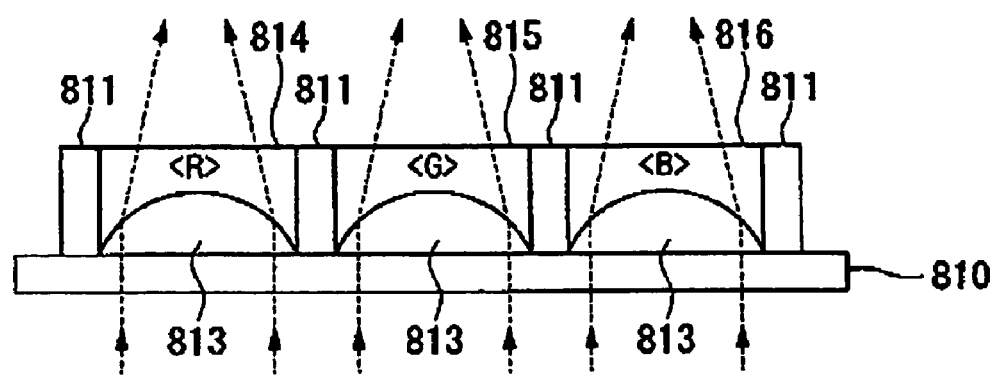
FIG. 14 is a diagram illustrating an exemplary embodiment of a color filter including micro lenses.

As shown in FIG. 14, respective color materials of red (R), green (G), and blue (B) 814, 815, and 816 can be disposed as color filter forming materials on the curved lenses 813 formed in the areas partitioned by the banks 811. Since the curved lenses 813 having the convex shape are formed in the areas partitioned by the banks 811 in advance, the color materials 814, 815, and 816 are stacked on the curved lenses 813 between the banks 811 through arrangement of the color materials 814, 815, and 816. The liquid droplet ejecting method may be used in the arrangement of the color materials 814, 815, and 816. As shown in FIG. 14, in the color filter, the light radiated from the base member 810 side passes through the curved lenses 813 having the convex shape and the color materials 814, 815, and 816 and then is taken out. At this time, the light is concentrated by passing through the curved lenses 813 and is converted into light components having predetermined wavelengths by passing through the respective color materials 814, 815, and 816. With the concentration of light by the curved lenses 813, enhancement of brightness of the extracted light can be achieved.

In this exemplary embodiment, the convex lenses are formed between the banks, but it should be understood that the shape of the lenses is not limited to this.

Figure 15A:
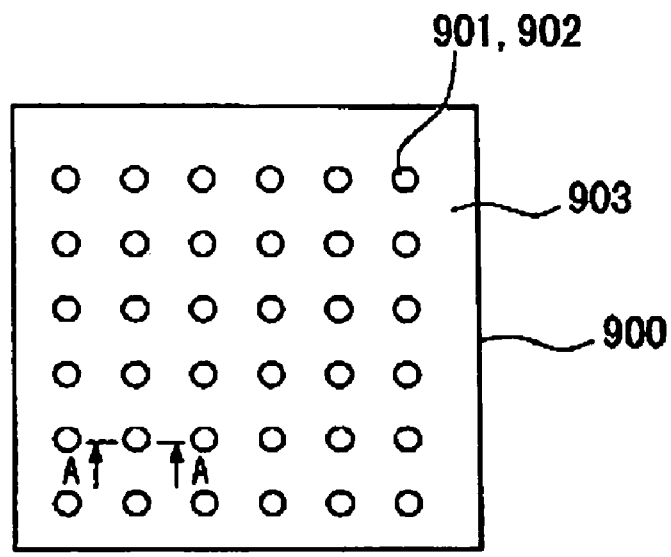
FIG. 15 is a schematic diagram illustrating an exemplary embodiment of a DNA chip formed using the banks according to the invention.
Figure 15B:
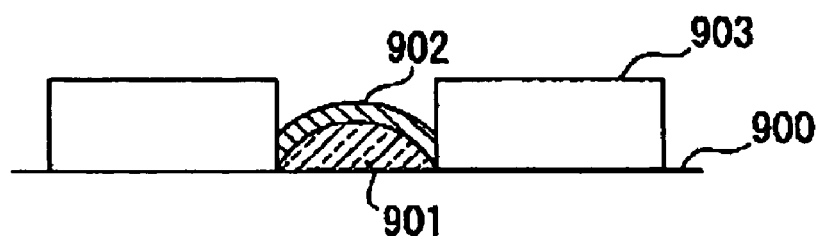
Figure 15C:
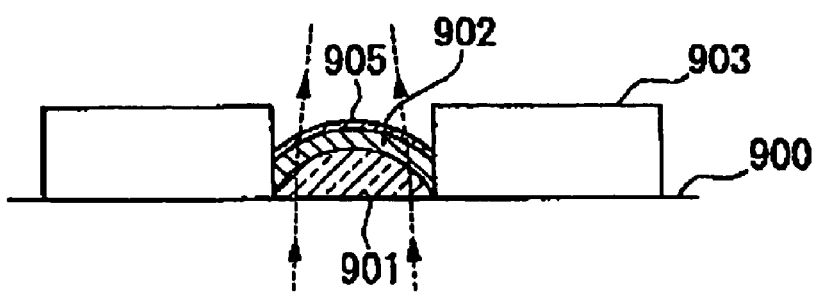

FIG. 15 is a diagram illustrating an exemplary embodiment of forming a DNA chip as an inspector using the banks according to the invention, where FIG. 15(a) is a plan view, and FIGS. 15(b) and 15(c) are cross-sectional views taken along the line A-A. Technologies for the DNA chip are disclosed, for example, in Japanese Unexamined Patent Application Publication No. 10-168386, Japanese Unexamined Patent Application Publication No. 2000-232883, etc.

In FIGS. 15(a) and 15(b), the DNA chip of this example has a construction that curved lenses 901 described with reference to FIG. 13 are formed on a base member 900 and reactant 902 is fixed onto the lenses 901. The lenses 901 and the reactant 902 are superposed on the areas partitioned by the banks 903 formed using the bank forming method according to the invention. As the reactant for the DNA chip, for example, DNA pieces are used. The DNA pieces of several tens to several hundreds of kinds of which gene sequences are found out in advance are contained in a solution and then fixed to the corresponding banks 903. In the DNA chip of this example, as shown in FIG. 15(c), the light is radiated from the rear side of the base member 900, passes through the lenses 901 and the reactant 902, and then is extracted. During utilization of the DNA chip of this example, liquid gene samples 905 are prepared and are disposed on the chip. When a gene corresponding to the samples exists, the gene reacts to the reactant 902 through a capture reaction, a base sequence thereof is specified, and fluorescent light is emitted by a synthesized fluorescent dye. The light radiated from the rear side of the base member 900 is concentrated by the lenses 901, and thus the brightness of the extracted light is increased, thereby enhancing visibility.

Figure 16A:
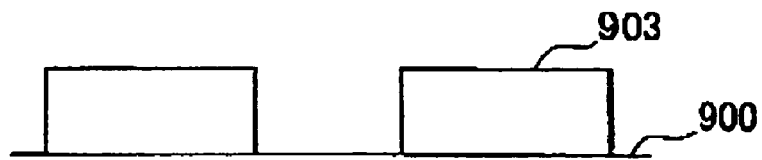
FIG. 16 is a schematic diagram illustrating processes of forming the DNA chip using the banks according to the invention.
Figure 16B:
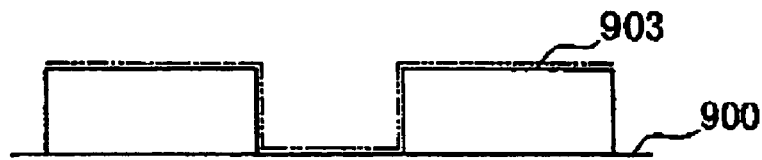
Figure 16C:
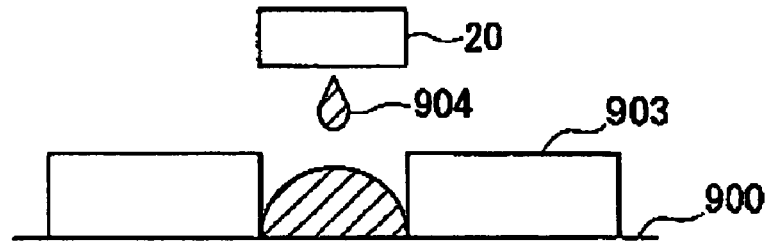
Figure 16D:
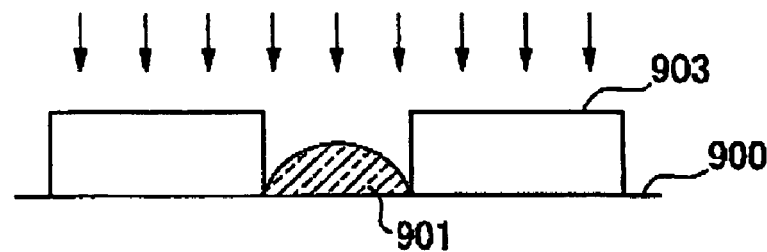
Figure 16E:
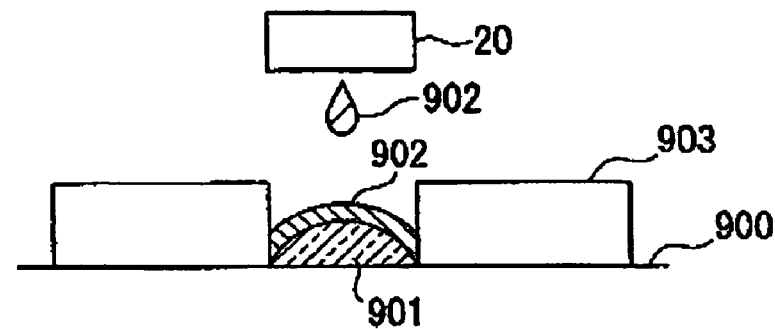

FIGS. 16(a) to 16(e) are schematic diagrams illustrating processes of manufacturing the DNA chip. For the purpose of simplification, in FIGS. 16(a) to 16(e), only the cross-section shown in FIG. 15(b) is partially enlarged and shown. First, as shown in FIG. 16(a), the banks 903 for partitioning areas in which the reactant is disposed are formed on the base member 900 on the basis of the bank forming method according to the invention. Then, as shown in FIG. 16(b), the lyophobic process is performed to the surfaces of the banks 903. Next, as shown in FIG. 16(c), the lens material 904 is arranged in the areas partitioned by the banks 903 by ejecting head 20. Next, as shown in FIG. 16(d), by radiating light onto the base member 900 on which the lens material 904 is arranged and curing the lens material 904, the curved lenses 901 having a convex shape are formed inside the banks 903. Next, as shown in FIG. 16(e), by arranging the reactant 902 in the areas partitioned by the banks 903 from the ejecting head 20 and fixing the reactant 902 onto the lenses 901, the DNA chip is manufactured.

In the aforementioned method of manufacturing a DNA chip, by arranging together the reactant 902 and the lens material 904 as a functional material in the areas partitioned by the banks 903, the lens material 904 and the reactant 902 are surely stacked inside the banks 903. Furthermore, since the liquid droplet ejecting method is used for arranging the materials, the waste of the lens material or the reactant is decreased and a desired amount of material is exactly arranged inside the banks 903.

What is claimed is:

1. A method of forming a bank that partitions a predetermined area of a base member on the base member and forming a wiring pattern on the base member, the method comprising:

radiating a first light to the base member over which a sublimation layer containing a sublimation material and a photothermal conversion layer are formed, the photothermal conversion layer being provided between the base member and the sublimation layer and containing a first photothermal conversion material that converts optical energy of the first light into a first thermal energy;

sublimating the sublimation material to form the banks, the sublimation layer including a binder resin with sublimation pigment or dye dispersed within;

arranging liquid droplets containing a wiring pattern forming material between the formed banks; and radiating a second light to the base member to generate a second thermal energy by the photothermal conversion layer to form the wiring pattern, the second thermal energy causing the wiring pattern forming material to exhibit conductivity.

2. The method according to claim 1, the sublimation material containing a sublimation pigment.

3. The method according to claim 1, a second photothermal conversion material, which converts at least some of the optical energy of the first light into a third thermal energy, being mixed into the sublimation layer.

4. The method according to claim 1, a surface treatment that adjusts an affinity for liquid being performed after radiating the first light.

5. The method according to claim 1, the first light being radiated from one surface side of the base member on which the sublimation layer is provided.

6. The method according to claim 5, the first light being radiated from another surface side of the base member on which the sublimation layer is not provided.

7. The method according to claim 1, the first light being radiated to the base member through a mask having a predetermined pattern.

8. The method according to claim 1, the radiation of the first light being performed while relatively moving the base member with respect to the first light.

9. The method according to claim 1, the materials separated from the base member being vacuumed and removed.

10. The method according to claim 1, the optical energy of the first light being optical energy of visible light.

11. The method according to claim 1, the base member being a glass substrate or transparent polymer.

* * * * *